US012732091B2

(12) United States Patent
Scaduto et al.

(10) Patent No.: US 12,732,091 B2
(45) Date of Patent: Sep. 8, 2026

(54) DRIVER CIRCUIT COMPRISING A POWER STAGE, RELATED HALF-BRIDGE DRIVER CIRCUIT, CONTROL CIRCUIT FOR AN ELECTRONIC CONVERTER, INTEGRATED CIRCUIT AND METHOD

(71) Applicant: STMicroelectronics International N.V., Geneva (CH)

(72) Inventors: Simone Scaduto, Mussomeli (IT); Salvatore Tricomi, San Gregorio di Catania (IT); Simone Manello, Buttigliera d'Asti (IT); Francesco Giorgio, Brolo (IT); Carmelo Alberto Santagati, Catania (IT); Stefano Saggini, Udine (IT); Federico Iob, Udine (IT); Agatino Antonino Alessandro, Rho (IT); Bruno Cavallaro, Acireale (IT)

(73) Assignee: STMicroelectronics International N.V., Geneva (CH)

( * ) Notice: Subject to any disclaimer, the term of this patent is extended or adjusted under 35 U.S.C. 154(b) by 153 days.

(21) Appl. No.: 18/767,557

(22) Filed: Jul. 9, 2024

(65) Prior Publication Data

US 2025/0023449 A1 Jan. 16, 2025

(30) Foreign Application Priority Data

Jul. 12, 2023 (IT) ........................ 102023000014532

(51) Int. Cl.
*H02M 1/08* (2006.01)
*H02M 1/00* (2006.01)
(Continued)

(52) U.S. Cl.
CPC ........... *H02M 1/08* (2013.01); *H02M 1/0054* (2021.05); *H02M 3/158* (2013.01);
(Continued)

(58) Field of Classification Search
CPC ...... H02M 1/08; H02M 1/0054; H02M 3/158; H03K 17/122; H03K 17/6871; H03K 2217/0063; H03K 2217/0072
See application file for complete search history.

(56) References Cited

U.S. PATENT DOCUMENTS

| | | | | |
|---|---|---|---|---|
| 10,523,119 | B2 | 12/2019 | Childs et al. | |
| 2010/0253309 | A1 | 10/2010 | Xi et al. | |
| 2010/0289473 | A1 | 11/2010 | Ishii et al. | |
| 2015/0108956 | A1 * | 4/2015 | Michal ................. | H03K 17/122 323/271 |

(Continued)

FOREIGN PATENT DOCUMENTS

WO 2023118783 A1 6/2023

OTHER PUBLICATIONS

V. Michal, "Peak-Efficiency Detection and Peak-Efficiency Tracking Algorithm for Switched-Mode DCâDC Power Converters," in IEEE Transactions on Power Electronics, vol. 29, No. 12, pp. 6555-6568, Dec. 2014. (Year: 2014).*

(Continued)

*Primary Examiner* — Gary L Laxton
*Assistant Examiner* — Jennifer C Caulk
(74) *Attorney, Agent, or Firm* — Crowe & Dunlevy LLC

(57) ABSTRACT

A power stage includes parallel FETs including a reference FET. An input PWM signal has a switching period. A current sensor senses current flowing through the power stage during switch-on period. A first circuit generates a first PWM signal having a duty-cycle indicative of reference FET driving losses for a reference current. A second circuit generates a second PWM signal having a duty-cycle indicative of reference FET conduction losses for that reference current. The duty cycles of the first and second PWM signals are compared to generate a comparison signal. The reference current is changed until a logic state of the comparison signal changes. A respective enable signal for each FET is generated by comparing the reference current to the sensed (Continued)

current flowing through the power stage. A FET driver circuit generates a respective drive signal for each FET by combining the respective enable signal with the input PWM signal.

21 Claims, 19 Drawing Sheets

(51) Int. Cl.
*H02M 3/158* (2006.01)
*H03K 17/687* (2006.01)

(52) U.S. Cl.
CPC . *H03K 17/6871* (2013.01); *H03K 2217/0063* (2013.01); *H03K 2217/0072* (2013.01)

(56) References Cited

U.S. PATENT DOCUMENTS

2018/0083524 A1 3/2018 Childs et al.
2019/0013732 A1 1/2019 Childs et al.
2021/0384828 A1 12/2021 Ferrara et al.
2022/0173657 A1* 6/2022 Ramorini ............ H02M 1/0009

OTHER PUBLICATIONS

Michal, Vratislav: "Peak-Efficiency Detection and Peak-Efficiency Tracking Algorithm for Switched-Mode DC—DC Power Converters," 2014 IEEE, 14 pgs.
IT Search Report and Written Opinion for priority application, IT Appl. No. 102023000014532, report dated Jan. 4, 2024, 8 pgs.

* cited by examiner

FIG. 3

20a
200a
200b
$V_{in}$
GND
$I_{Q1}$
Q1
$DRV_1$
Lx
$I_{Q2}$
Q2
$DRV_2$
GND
CONTROL CIRCUIT
22
$V_{ref}$
FB
24
L
$I_L$
$C_{out}$
$I_{out}$
202a
202b
$V_{out}$ $T_{SW}$
$T_{ON1}$
$T_{OFF1}$
$DRV_1$
$DRV_2$
$I_{Q1}$
$V_{Lx}$
$I_L$
t
t
t
t
t
$t_1$
$t_2$ $T_{sw}$
$DRV_1$
$T_1$
t
$DRV_2$
$T_2$
t
$I_L$
$I_{max}$
$I_{min}$
t
$t_2$
$t_1$ $T_{sw}$
$DRV_1$
$t_1$
t
$DRV_2$
$T_2$
$T_3$
t
$I_L$
$I_{max}$
t
ZC
t
$t_2$
$t_3$
$t_1$ 44
VDD
M3
M4
$I_{DAC}$
F
PWM
$\overline{PWM}$
SW1
SW2
SW3
SW4
VDD
O
$\overline{O}$
M5
E
XN
444
Vgs
OP1
448
R3
R4
Vgs
B
C
446
$V_{th1}$
$V_{th2}$
DAC
trial_current_cfg
440
442

46
CompS
478
472
RST
C1
476
474
466
460
470
468
464
462
I2
I1
Od
O 54
544
CONV.
N
IC
$IC_1$
$IC_2$
$IC_3$
$IC_4$
1:1
1:2
1:3
1:4
1:1
1:1
1:1
1:1
VDD
$I_{opt}$
$I_Q$
540
542

58H
58HB
60
PWM GENERATE
580H
LS
PWMH
PWMH'
582H
584H
PWMH1
PWMH2
PWMHK1
DH1
DH2
DHK1
580L
582L
584L
Combo
PWML'
PWML1
PWML2
PWMLK2
DL1
DL2
DLK2
PWML
58L
QHB
NHS
NLS
ENH1
ENH2
ENHK1
ENL1
ENL2
ENLK2
HALF-BRIDGE PARTITIONING
50HB
IQ
SW
L
30
COUT
26
62
Vin
SH1
SH2
SHK1
DHK1
DH1
DH2
SWo
SL1
SL2
SLK2
DL1
DL2
DLK2
QHS
QLS 50HB
PWMH
PWML
506
PWM
Conduct. Loss
44
O
Duty Cycle
46
SEL
$V_{gsHS}$
$V_{gsLS}$
508
$V_{gs}$
Drive Loss
42
Od
CompS
RES
Control (FSM)
52HB
Register
502HS
CFG_OPTHS
504HS
$I_{optHS}$
Compare
54HS
$I_{QHS}$
NHS
56HS
Mapping
ENH1
$ENHK_1$
trial_current_cfg
W_CFG_HS
W_CFG_LS
Register
502LS
CFG_OPTLS
504LS
$I_{optLS}$
Compare
54LS
$I_{QLS}$
NLS
Mapping
56LS
ENL1
$ENLK_2$

FIG. 21

582H
PWMH1
$V_{BOOT}$
$\overline{SW}$
A
ENH1'
INV2
INV1
INV3
INV4
ST1
ST2
ST3
ST4
PWMH'
ENH1
$\overline{PWMH}$/PWML

DRIVER CIRCUIT COMPRISING A POWER STAGE, RELATED HALF-BRIDGE DRIVER CIRCUIT, CONTROL CIRCUIT FOR AN ELECTRONIC CONVERTER, INTEGRATED CIRCUIT AND METHOD

PRIORITY CLAIM

This application claims the priority benefit of Italian Application for Patent No. 102023000014532, filed on Jul. 12, 2023, the content of which is hereby incorporated by reference in its entirety to the maximum extent allowable by law.

TECHNICAL FIELD

Embodiments of the present disclosure relate to solutions for a power stage partitioning, wherein an electronic power stage is implemented with a plurality of Field Effect Transistors (FETs) connected in parallel, and/or a single FET wherein a width of the active channel may be controlled selectively, thereby virtually implementing a plurality of electronic switches connected in parallel.

BACKGROUND

Power-supply circuits, such as AC/DC or DC/DC switched mode power supplies (SMPS), are well known in the art. There exist many types of electronic converters, which are mainly divided into isolated and non-isolated converters. For instance, non-isolated electronic converters are the converters of the "buck", "boost", "buck-boost", "Ćuk", "SEPIC", and "ZETA" type. Instead, isolated converters are, for instance, converters of the "flyback", "forward", "half-bridge", and "full-bridge" type. Such types of converters are well known to the person skilled in the art, as evidenced, e.g., by the application note AN513/0393 "Topologies for Switched Mode Power Supplies", L. Wuidart, 1999, STMicroelectronics (incorporated herein by reference).

FIG. 1 is a schematic illustration of a DC/DC electronic converter 20. In particular, a generic electronic converter 20 comprises two input terminals 200*a* and 200*b* for receiving a DC voltage $V_{in}$ and two output terminals 202*a* and 202*b* for supplying a DC voltage $V_{out}$. For example, the input voltage $V_{in}$ may be supplied by a DC voltage source 10, such as a battery, or may be obtained from an AC voltage by means of a rectifier circuit, such as a bridge rectifier, and possibly a filtering circuit. The output voltage $V_{out}$ may be used to supply a load 30.

As is well-known, an electronic converter comprises one or more reactive components, such as inductances and/or capacitances, and one or more electronic switches configured to control: the current flow from the input terminals 200*a* and 200*b* to the one or more reactive components; and/or the current flow from the one or more reactive components to the output terminals 202*a* and 202*b*.

In order to reduce the power consumption of the converter, recently it has also been proposed to use a power stage partitioning or segmentation, wherein one or more of the electronic switches of the electronic converter 20 are implemented with: a plurality of electronic switches, such as FETs, connected in parallel; and/or a single FET wherein a width of the active channel may be controlled selectively, thereby virtually implementing a plurality of electronic switches connected in parallel.

For example, such a solution is disclosed in United States Patent Application Publication No. 2022/0173657 A1 or the article by Michal Vratislav, "Peak-Efficiency Detection and Peak-Efficiency Tracking Algorithm for Switched-Mode DC-DC Power Converters", IEEE Transactions on Power Electronics, 2014, doi:10.1109/TPEL.2014.2304491 (both of which are incorporated herein by reference).

For example, FIG. 2 shows an example wherein a power stage Q, is implemented with a plurality of Field-Effect Transistors (FETs), connected in parallel, such as four FETs S1, S2, S3 and S4. In this case, the drain terminals of the plurality of FETs S1-S4 are connected to a first node/terminal N1 and the source terminals of the plurality of FETs S1-S4 are connected to a second node/terminal N2. Conversely, each of the gate terminals of the plurality of FETs S1-S4 is connected to a respective terminal for receiving a respective drive signal, e.g., drive signals D1, D2, D3 and D4. Generally, also any other number of parallel connected electronic switches with respective drive signals may be used, such as 2, 3, 5, 6, 7, 8 or more electronic switches.

Accordingly, in this case, a control circuit of the electronic converter may be configured to generate the drive signals D1-D4 for the electronic switches S1-S4, in order to select the number of electronic switches which should be closed contemporaneously.

In fact, the primary sources of loss of a FET usually vary with different load currents. For example, at high current, the dominant source of loss is the power converted into heat across the resistance of the FET, i.e., Ohmic losses. At low current, the dominant source derives from switching on and off the FET, i.e., dynamic losses such as switching and driving. For example, the power required to switch on and off the gate of a FET is usually rather constant at any load, but as more current is drawn by the load, the power used to switch the gate becomes a less significant portion of the total power converted.

Thus, when splitting the power stage Q into a plurality of (physical and/or virtual) parallel FETs, the effective size of the power switch may be controlled, and the control circuit of the electronic converter may balance: the total switch-on resistance $R_{ds,ON}$, which decreases when increasing the number of closed electronic switches; and the switching losses, which decrease when decreasing the number of closed electronic switches.

For example, the control circuit may be configured to: at high current flows, close more electronic switches S1-S4, thereby reducing the power losses in the switch-on resistance $R_{ds,ON}$; and at low current flows, close less electronic switches S1-S4, thereby reducing the switching losses required to close the electronic switches S1-S4.

For example, in order to decide the number of electronic switches S1-S4 which should be closed, i.e., the partitioning or segmentation of the power stage Q, the control circuit may determine an indicative value of (and preferably proportional to) the average current flowing through the power stage Q (i.e., the total current flowing through the electronic switches S1-S4). For example, in typical solutions, the control circuit is configured to monitor the average current flowing through the power stage Q and set the number of active FETs using pre-defined current thresholds, which are calculated for typical application cases. However, during usage, the operating conditions may change and the pre-defined current thresholds may no longer be representative for an optimal efficiency. For example, the operating conditions may change when the supply voltage of the FETs, the switching frequency, the switch-on and switch-off durations and/or the operating temperature changes, and/or due to process variations and/or aging.

In view of the above, there is a need to provide solutions for controlling in a more efficient manner the partitioning of a power stage.

SUMMARY

In various embodiments, the solutions disclosed herein are able to dynamically adapt the current thresholds to the current operating conditions of the power stage.

According to one or more embodiments, one or more of the above objectives is achieved by means of a driver circuit for a power stage. Embodiments moreover concern a related half-bridge driver circuit, control circuit for an electronic converter, integrated circuit and method.

As mentioned before, various embodiments of the present disclosure relate to a driver circuit comprising a power stage comprising a plurality of FETs. The driver circuit comprises a terminal configured to receive a PWM signal with a given switching period, wherein the PWM signal is asserted for a switch-on period in order to indicate that the power stage should be closed and de-asserted for a switch-off period in order to indicate that the power stage should be opened. In various embodiments; a current sensor is configured to provide a signal indicative of the current flowing through the power stage during the switch-on period. For example, in various embodiments, the signal indicative of the current flowing through the power stage during the switch-on period indicates the Root-Means-Square value of the current flowing through the power stage during the switch-on period or the maximum/peak value of the current flowing through the power stage during the switch-on period.

In various embodiments, the driver circuit comprises a reference capacitance, a reference resistance, a first circuit, a second circuit, a duty-cycle comparison circuit, a control circuit, a comparison circuit and a FET driver circuit.

Specifically, in various embodiments, one of the plurality of FETs represents a reference FET, wherein the reference FET is closed by applying a gate-source voltage between a gate terminal and a source terminal of the reference FET. In this case, the reference capacitance comprises a first scaled FET corresponding to a scaled version of the reference FET and the reference resistance comprises a second scaled FET corresponding to a scaled version of the reference FET.

In various embodiments, the first circuit is configured to generate a ramp signal at the reference capacitance by connecting a gate terminal of the first scaled FET after a multiple of the switching periods to ground and then applying a first current to the gate terminal of the first scaled FET, wherein the first current is proportional to a reference current. The first circuit also asserts a first PWM signal in response to determining that a voltage at the capacitance is smaller than a reference voltage and de-asserts the first PWM signal in response to determining that the voltage at the capacitance is greater than the first reference voltage, wherein the reference voltage is proportional to the gate-source voltage. For example, in various embodiments, the first circuit connects at the beginning of each switching period the gate terminal of the first scaled FET to ground.

In various embodiments, the second circuit is configured to apply a second current to a capacitance when the PWM signal is asserted, wherein the second current is proportional to the reference current. Moreover, the second circuit generates a third current by applying a voltage being proportional to the gate-source voltage to the reference resistance, and applies the third current to the capacitance when a second PWM signal is asserted, wherein the second current applied to the capacitance and the third current applied to the capacitance have opposite signs. Finally, the second circuit asserts the second PWM signal in response to determining that a voltage at the capacitance exceeds a first threshold and de-asserts the second PWM signal in response to determining that the voltage at the capacitance exceeds a second threshold.

In various embodiments, the duty-cycle comparison circuit is configured to set a comparison signal to a first logic level in response to determining that a duty-cycle of the first PWM signal is greater than a duty-cycle of the second PWM signal and a second logic level in response to determining that the duty-cycle of the first PWM signal is smaller than the duty-cycle of the second PWM signal. For example, in various embodiments, the duty-cycle comparison circuit comprises a differential current integrator and is configured to periodically reset the differential current integrator and then apply a first reference current to a first terminal of the differential current integrator when the first PWM signal is asserted and a second reference current to a second terminal of the differential current integrator when the second PWM signal is asserted. Finally, the duty-cycle comparison circuit may generate the comparison signal as a function of the differential voltage at the output of the differential current integrator.

In various embodiments, the control circuit is configured to set the reference current to an initial value and then either increase or decrease the reference current until the logic level of the comparison signal (e.g., sampled after a given time period, e.g., a given number of clock cycles) changes.

In various embodiments, the comparison circuit is configured to determine for each FET of the plurality of FETs a respective enable signal by comparing the value of the reference current when the logic level of the comparison signal changes with the signal indicative of the current flowing through the power stage during the switch-on period. For example, in various embodiments, the comparison circuit is configured to determine a signal indicative of a partitioning value of the power stage by determining for each partitioning value of a plurality of partitioning values respective upper and lower threshold values as a function of the value of the reference current when the logic level of the comparison signal changes, and selecting one of the partitioning values by comparing the signal indicative of the current flowing through the power stage during the switch-on period with the upper and lower threshold values. For example, in various embodiments, each FET of the plurality of FETs has a respective partitioning factor and the comparison circuit is configured to determine the enable signals as a function of the partitioning factors of the of the plurality of FETs and a signal indicting the selected partitioning value.

For example, in various embodiments, the driver circuit comprises a current digital-to-analog converter configured to generate the reference current as a function of a digital signal. In this case, the control circuit may be configured to set the digital signal to an initial value and then either increase or decrease the digital signal until the logic level of the comparison signal changes. Next, the control circuit may store the digital signal in response to determining that the logic level of the comparison signal changes. Accordingly, in this case, the comparison circuit may be configured to compare the stored digital signal with the signal indicative of the current flowing through the power stage during the switch-on period.

Finally, in various embodiments, the FET driver circuit is configured to generate for each FET of the plurality of FETs a respective drive signal by combining a respective enable signal with the PWM signal. For example, in various embodiments, the FET driver circuit is configured to generate for each FET of the plurality of FETs a respective drive signal by asserting the respective drive signal when the PWM signal is asserted and the respective enable signal indicates that the respective FET is enabled, and de-asserting the respective drive signal when the PWM signal is de-asserted or the respective enable signal indicates that the respective FET is disabled.

In various embodiments the driver circuit may also be used to drive a low-side power stage and a high-side power stage implementing a half bridge.

For example, in various embodiments, the power stage of the driver circuit may be the low-side power stage comprising a plurality of low-side FETs connected between a switching node and a ground, wherein one of the low-side FETs represents the reference FET; wherein the terminal of the driver circuit is configured to receive a low-side PWM signal. In this case, the driver circuit comprises thus also a high-side power stage comprising a plurality of high-side FETs connected between a supply voltage and the switching node and a further terminal configured to receive a high-side PWM signal with the given switching period, wherein the high-side PWM signal is asserted for a switch-on period in order to indicate that the high-side power stage should be closed and de-asserted for a switch-off period in order to indicate that the high-side power stage should be opened. In this case, the current sensor of the driver circuit may be configured to provide a signal indicative of the current provided by the switching node;

Instead of using two independent driver circuits, the driver circuit may use a low-side mode and a high-side mode. Specifically, in this case, the second circuit of the driver circuit may be configured to, in the low-side mode, apply the second current to the capacitance when the low-side PWM signal is asserted and, in the high-side mode, apply the second current to the capacitance when the high-side PWM signal is asserted. Moreover, the control circuit of the driver circuit may be configured to, in the low-side mode, set the reference current to an initial value and then either increase or decrease the reference current until the logic level of the comparison signal changes, and store a low-side value indicative of the value of the reference current when the logic level of the comparison signal changes. Similarly, in the high-side mode, the control circuit may set the reference current to an initial value and then either increase or decrease the reference current until the logic level of the comparison signal changes, and store a high-side value indicative of the value of the reference current when the logic level of the comparison signal changes.

Accordingly, in this case, the comparison circuit of the driver circuit may be configured to determine for each FET of the plurality of low-side FETs a respective low-side enable signal by comparing the low-side value with the signal indicative of the current provided by the switching node. Conversely, a further comparison circuit may be configured to determine for each FET of the plurality of high-side FETs a respective high-side enable signal by comparing the high-side value with the signal indicative of the current provided by the switching node.

Accordingly, the FET driver circuit of the driver circuit may be configured to generate for each FET of the plurality of low-side FETs a respective drive signal by combining a respective low-side enable signal with the low-side PWM signal, and a further FET driver circuit may be configured to generate for each FET of the plurality of high-side FETs a respective drive signal by combining a respective high-side enable signal with the high-side PWM signal. In various embodiments, the further FET driver circuit may comprise for each high-side enable signal a respective level-shifter circuit configured to generate a level-shifted version of the respective enable signal.

BRIEF DESCRIPTION OF THE DRAWINGS

Embodiments of the present disclosure will now be described with reference to the annexed drawings, which are provided purely by way of non-limiting example and in which:

FIG. 3 shows an embodiment of a buck converter;

FIG. 21 shows a first embodiment of a level shifter for the circuit of FIG. 19.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
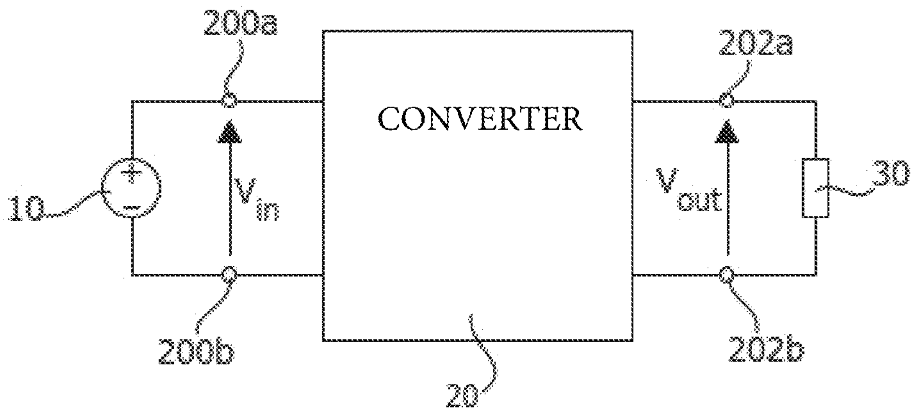
FIG. 1 shows an example of an electronic converter.
Figure 2:
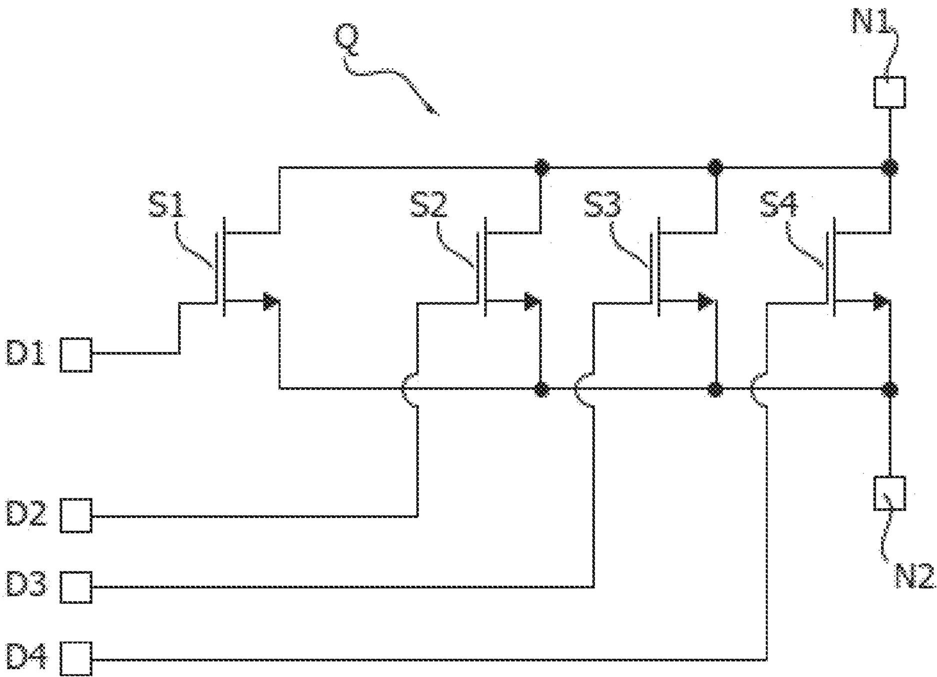
FIG. 2 shows an example of the implementation of a power stage with a plurality of parallel FETs.

In the following FIGS. 3 to 23 parts, elements or components which have already been described with reference to FIGS. 1 and 2 are denoted by the same references previously used in such Figures; the description of such previously described elements will not be repeated in the following in order not to overburden the present detailed description.

As mentioned before, the present disclosure relates to solutions for controlling the partitioning/segmentation of a power stage. As mentioned before, such solutions are particular useful in case of electronic converters. However, the solutions disclosed herein may also be used for other applications, where the partitioning/segmentation of a power stage has to be controlled.

Figure 3:
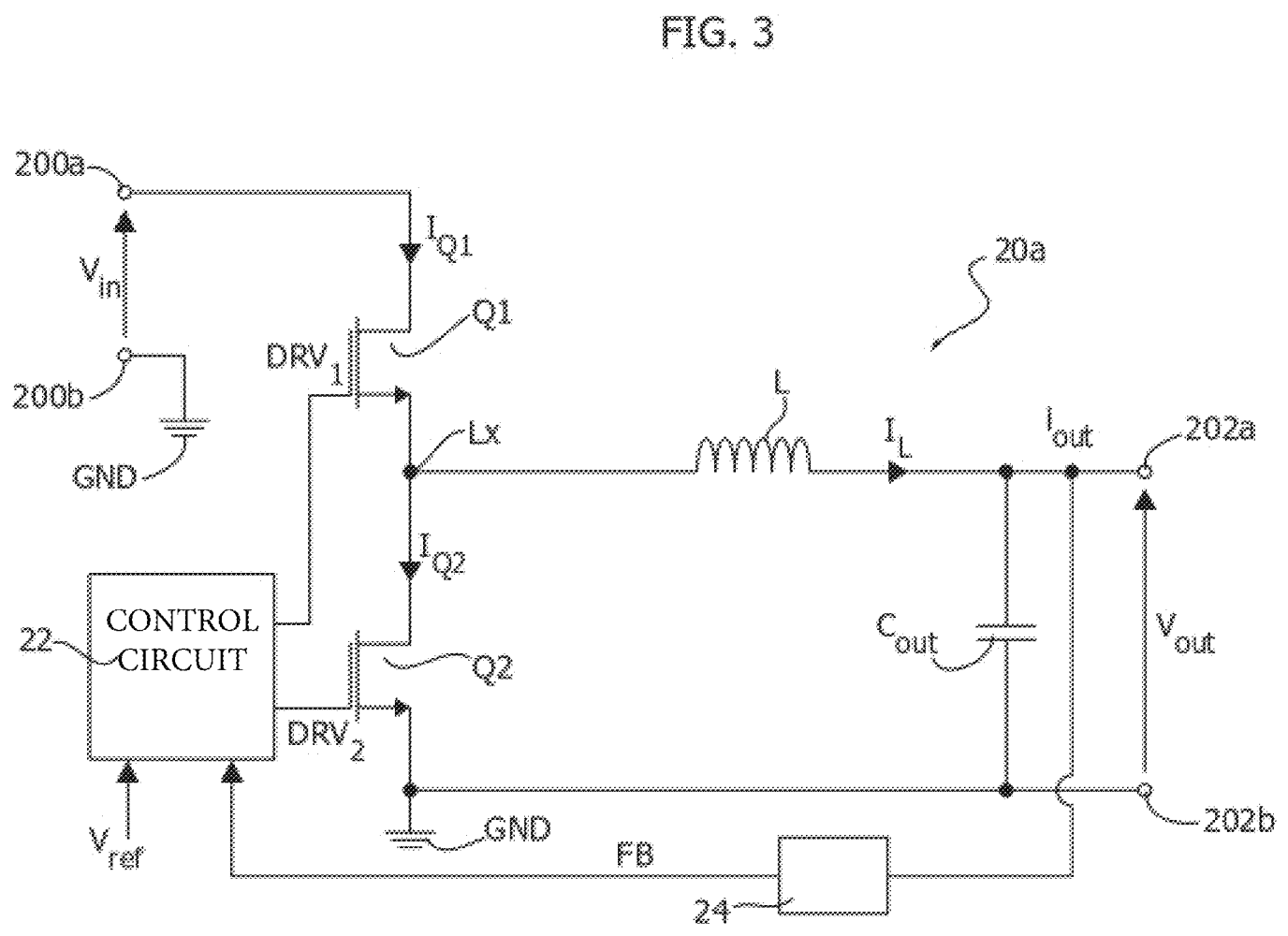

FIG. 3 shows the circuit schematic of an embodiment of a buck converter 20*a*. In particular, a buck converter 20*a* comprises two input terminals 200*a* and 200*b* for receiving a DC input voltage $V_{in}$ and two output terminals 202*a* and 202*b* for supplying a regulated voltage $V_{out}$, where the output voltage is equal to or lower than the input voltage $V_{in}$.

In the embodiment considered, the buck converter 20*a* comprises two electronic switches Q1 and Q2 (with the current path thereof) connected (e.g., directly) in series between the input terminals 200*a* and 200*b*, wherein the intermediate node between the electronic switches Q1 and Q2 represents a switching node Lx. Specifically, the electronic switch Q1 is a high-side switch connected (e.g., directly) between the (positive) terminal 200*a* and the switching node Lx, and the electronic switch Q2 is a low-side switch connected (e.g., directly) between the switching node Lx and the (negative) terminal 200*b*, which often represents a ground GND. The (high-side) switch Q1 and the (low-side) switch Q2 hence represent a half-bridge configured to connect the switching node Lx to the terminal 200*a* (voltage $V_{in}$) or the terminal 200*b* (ground GND).

In various embodiments, the switches Q1 and/or Q2 are transistors, such as Field-Effect Transistors (FETs), such as Metal-Oxide-Semiconductor Field-Effect Transistors (MOSFETs), e.g., n-channel FET, such as NMOS. Frequently, the second electronic switch Q2 is also implemented just with a diode, where the anode is connected to the terminal 200*b* and the cathode is connected to the switching node Lx.

In the embodiment considered, an inductance L, such as an inductor, is connected (e.g., directly) between the switching node Lx and the (positive) output terminal 202*a*. Instead, the (negative) output terminal 202*b* is connected (e.g., directly) to the (negative) input terminal 200*b*.

In the embodiment considered, to stabilize the output voltage $V_{out}$, the converter 20 typically comprises a capacitor $C_{out}$ connected (e.g., directly) between the output terminals 202*a* and 202*b*.

Figures 4A, 4B, 4C, 4D, 4E:
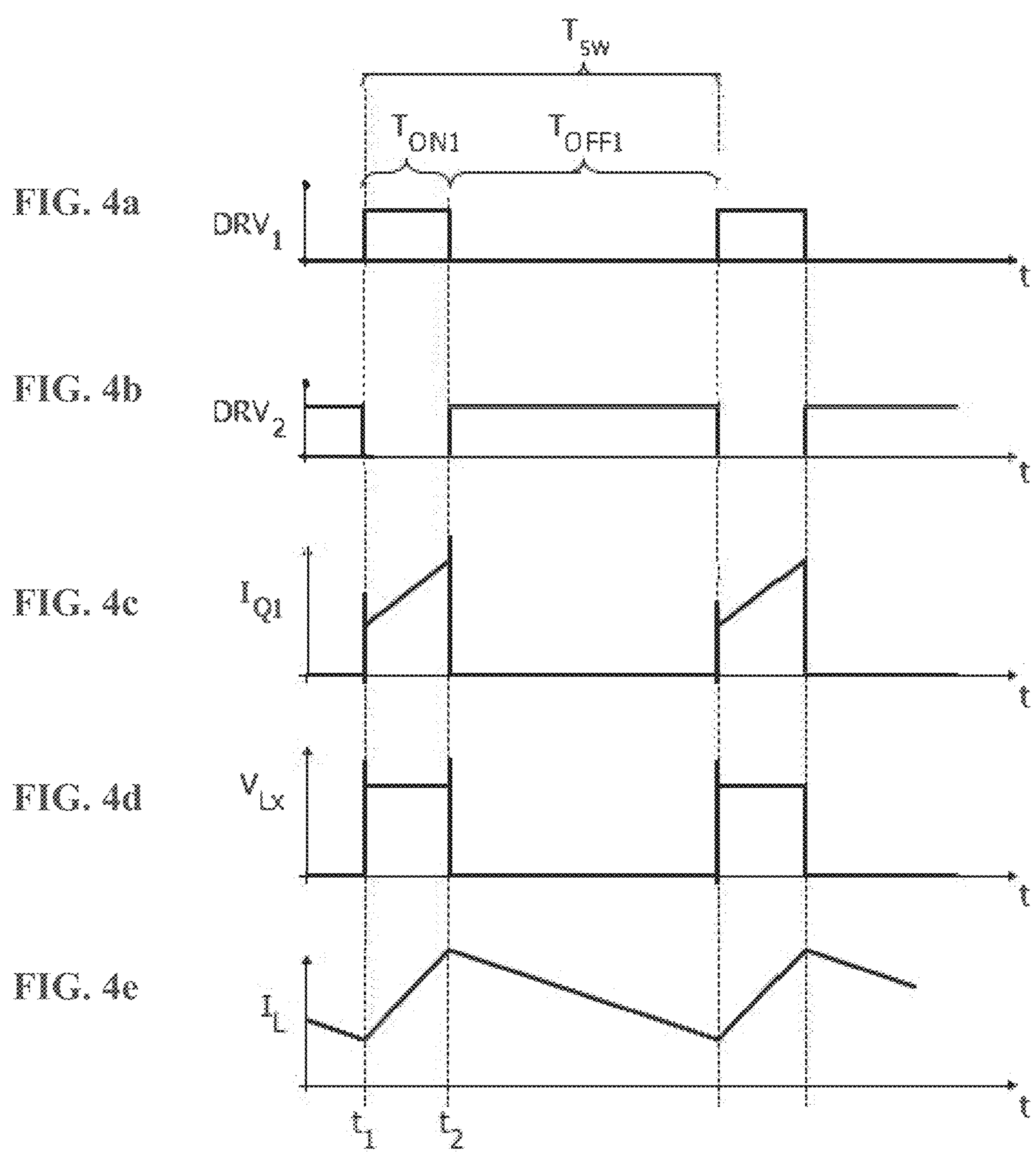
FIGS. 4*a*-4*e* show exemplary waveforms of the operation of the converter of FIG. 3.

In this context, FIG. 4 shows exemplary waveforms of the signals of such an electronic converter, where: FIG. 4*a* shows the signal $DRV_1$ for switching the electronic switch Q1; FIG. 4*b* shows the signal $DRV_2$ for switching the second electronic switch Q2; FIG. 4*c* shows the current $I_{Q1}$ that traverses the electronic switch Q1; FIG. 4*d* shows the voltage $V_{Lx}$ at the switching node Lx (i.e., the voltage at the second switch Q2); and FIG. 4*e* shows the current $I_L$ that traverses the inductor L.

In particular, when the electronic switch Q1 is closed at an instant $t_1$ (ON state), the current $I_L$ in the inductor L increases (substantially) linearly. The electronic switch Q2 is at the same time opened. Instead, when the electronic switch Q1 is opened after an interval $T_{ON1}$ at an instant $t_2$ (OFF state), the electronic switch Q2 is closed, and the current $I_L$ decreases (substantially) linearly. Finally, the switch Q1 is closed again after an interval $T_{OFF1}$. In the example considered, the switch Q2 is hence closed when the switch Q1 is open, and vice versa. The current $I_L$ may thus be used to charge the capacitor Cout, which supplies the voltage $V_{out}$ at the terminals 202*a* and 202*b*.

In the embodiment considered, the electronic converter 20*a* comprises thus a control circuit 22 configured to drive the switching of the switch Q1 and of the switch Q2, for repeating the intervals $T_{ON1}$ and $T_{OFF1}$ periodically. For example, typically the buck converter 20 comprises also a feedback circuit 24, such as a voltage divider, configured to generate a feedback signal FB indicative of (and preferably proportional to) the output voltage $V_{out}$, and the control circuit 22 is configured to generate the drive signals $DRV_1$ and $DRV_2$ by comparing the feedback signal FB with a reference signal, such as a reference voltage $V_{ref}$.

A significant number of driving schemes are known for generating the drive signals $DRV_1$ and $DRV_2$. These solutions have in common the possibility of regulating the output voltage $V_{out}$ by regulating the duration of the interval $T_{ON1}$ and/or the interval $T_{OFF1}$. For example, in various embodiments, the control circuit 22 generates a Pulse-Width Modulation (PWM) signal $DRV_1$, wherein the duty-cycle $D=T_{ON1}/(T_{ON1}\pm T_{OFF1})$ is variable. For example, a typical control scheme involves that the duty-cycle D is varied via a regulator circuit having at least an integral component, such as a PI (Proportional-Integral) or PID (Proportional-Integral-Derivative) regulator.

In general, a buck converter may be operated in a Continuous-Conduction Mode (CCM), Discontinuous-Conduction Mode (DCM) or Transition Mode (TM). Generally, the control circuit may also be configured to selectively operate the switching stage in a High-Power Mode (HPM) or in a Low-Power Mode (LPM).

Figures 5A, 5B:
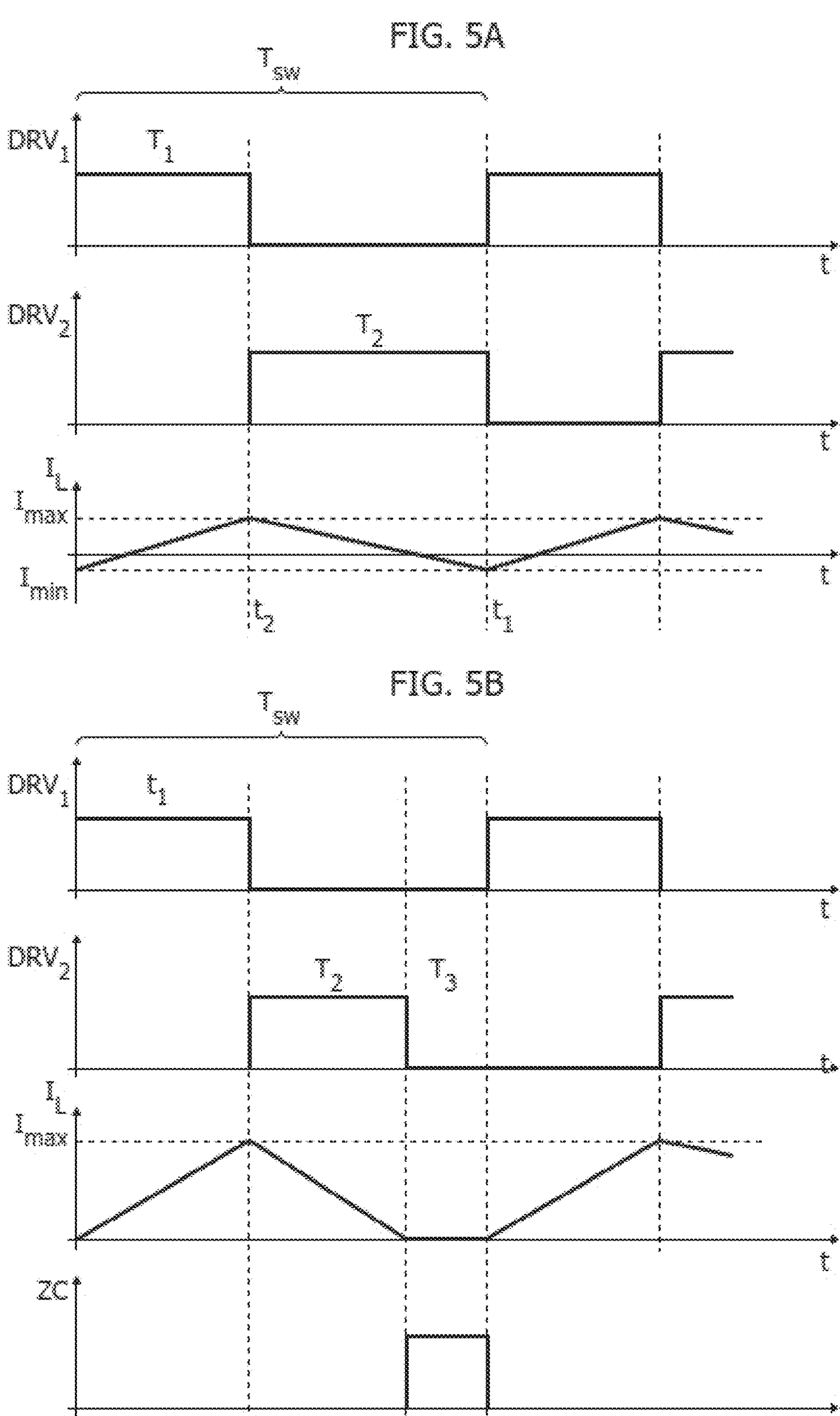
FIG. 5A shows exemplary waveforms when an electronic converter is operated in CCM.
FIG. 5B shows exemplary waveforms when an electronic converter is operated in DCM.

For example, in the high-power mode, the control circuit 22 may be configured to drive the switches in CCM. As shown in FIG. 5A, when the control circuit 22 operates the converter in CCM, the current $I_L$ flowing through the inductance L has a value different from zero when the switching cycle $T_{SW}$ ends. In this case, the control circuit 22 uses two switching phases $T_1$ and $T_2$, with $T_{SW}=T_1+T_2$, wherein: during the phase $T_1(T_1=T_{ON1}=T_{OFF2})$ the switch Q1 is closed and the switch/diode Q2 is opened; and during the phase $T_2$ $(T_2=T_{OFF1}=T_{ON2})$ the switch Q1 is opened and the switch/diode Q2 is closed.

In various embodiments, CCM uses a constant frequency PWM modulation. For example, in this case, the instant $t_1$ may be started periodically after a constant time $T_{SW}$. Conversely, the instant $t_2$ may be determined as a function of the feedback signal FB and the reference signal $V_{ref}$, e.g.: by using a Proportional-Integral (PI) or Proportional-Integral- Derivative (PID) regulator configured to directly vary the duty-cycle D or the switch-on time $T_{ON1}$ in order to regulate the feedback signal FB to the reference signal $V_{ref}$, or by ending the switch-on interval $T_{ON1}$ when the current $I_L$ flowing through the inductance L (or a value indicative of this current) reaches a maximum threshold value, wherein a PI or PID regulator is configured to vary the maximum threshold value in order to regulate the feedback signal FB to the reference signal $V_{ref}$.

Conversely, in the low-power mode, the control circuit 22 may be configured to drive the switches in a burst mode. Specifically, in this case, the control circuit 22 is configured to alternatively close the electronic switches Q1 and Q2 for one or more cycles, and then both electronic switches are opened. Thus, in this case, the control circuit 22 uses (at least for the last burst) indeed three switching phases $T_1$, $T_2$ and $T_3$, with $T_{SW}=T_1+T_2+T_3$, wherein: during the phase $T_1$ ($T_1=T_{ON1}$) the switch Q1 is closed and the switch/diode Q2 is opened; during the phase $T_2$ ($T_2=T_{ON2}$) the switch Q1 is opened and the switch/diode Q2 is closed; and during the phase $T_3$ ($T_{OFF1}=T_2+T_3$ and $T_{OFF2}=T_3+T_1$) the switch Q1 is opened and the switch/diode Q2 is opened.

For example, as shown in FIG. 5B, the control circuit 22 may be configured to: open the switch Q1 and close the switch Q2 at an instant $t_2$ after a constant switch-on time or after a switch-on time determined as a function of the feedback signal FB; open the electronic switch Q2 preferably when the current $I_L$ reaches zero at an instant $t_3$, thereby reducing switching losses; and start a new switching cycle at an instant $t_1$ when the feedback signal FB reaches a lower threshold.

For example, the lower threshold may be determined as a function of the reference signal $V_{ref}$ being indicative of the requested output voltage $V_{out}$.

In various embodiments, also (usually fixed) dead times may be introduced between the switching of the drive signals, e.g., between the falling edge of the signal $DRV_1$ and the rising edge of the signal $DRV_2$, and similarly (in CCM mode) between the falling edge of the signal $DRV_2$ and the rising edge of the signal $DRV_1$. Insofar as these intervals are usually short compared to the durations $T_{ON}$ and $T_{OFF}$, these intervals will not be considered specifically in the following.

Thus, essentially, the burst mode may correspond to a special case of DCM, wherein the electronic switch Q2 is opened (and remains opened during the interval $T_3$) when the current $I_L$ reaches zero.

Figure 6:
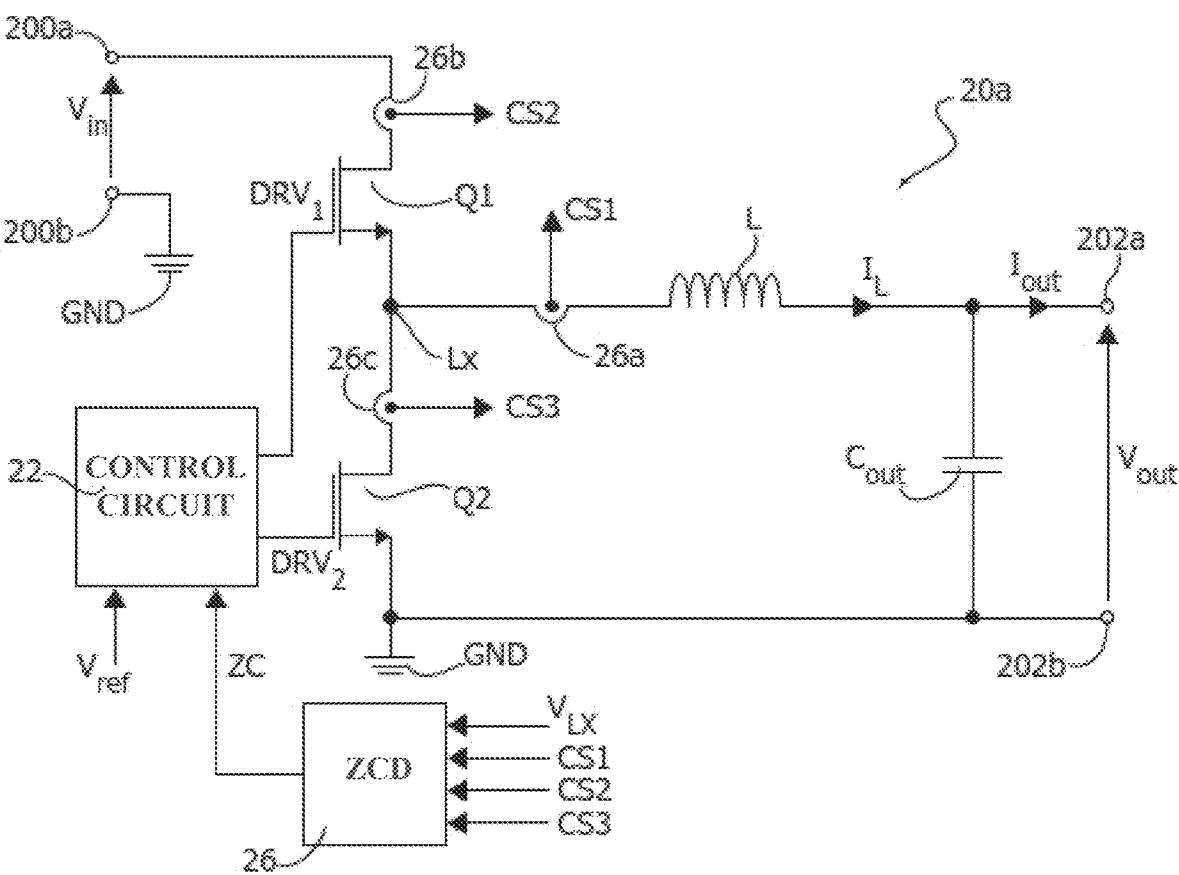
FIG. 6 shows an embodiment of a buck converter comprising one or more current sensors.

As shown in FIG. 6, for this purpose, the control circuit 22 may comprise or be connected to a zero-current detection (ZCD) circuit 26 configured to generate a zero-current signal ZC indicating (at least) the instant $t_3$ when the current $I_L$ reaches zero, in particular at least during the interval $T_2$. For example, such a zero-current detection circuit 26 may comprise a current sensor 26*a* connected directly in series with the inductance L, wherein the current sensor 26*a* provides a signal CS1 indicative of (and preferably proportional to) the current $I_L$ flowing through the inductance L. In various embodiments, the current sensor 26*a* may also be replaced with current sensors 26*c* configured to provide a signal CS3 indicative of (and preferably proportional to) the current $I_{Q2}$ flowing through the switch Q2, which corresponds to the current $I_L$ flowing through the inductance L during the interval $T_2$.

For example, the zero-current signal ZC may be determined via a comparator of the ZCD circuit 26, so called zero current comparator, e.g., configured to determine whether the monitored signal CS1 or CS3 falls below a given threshold (which is usually close to zero). For example, in FIG. 5B is shown an example of the zero-current signal ZC, which is set to high when the measured current is smaller than the threshold (close to zero).

Accordingly, in the embodiment considered, the electronic switches Q1 and Q2 are the power switches of the electronic converter 20*a*. Accordingly, as described with respect to FIG. 2, each of the electronic switches Q1 and Q2 may be replaced with a respective power stage Q comprising a plurality of (physical) parallel electronic switches and/or an electronic switch, which may be partitioned into a plurality of partitions/segments. In this case, the control circuit 22 is thus configured to generate a number K of drive signals D1-DK for a respective number K of (physical or virtual) switches S1-SK of each of the power stages Q1 and Q2, in order to select a number N of electronic switches to be closed. For example, in various embodiments, the power stages Q1 and Q2 are implemented with the same number of parallel-connected (physical or virtual) electronic switches S1-SK, i.e., $K_1=K_2=K$.

For example, in order to close a given number $N_1$ of the electronic switches S1-SK implementing the power stage Q1, the control circuit 22 may set $N_1$ drive signals D1-DK of the power stage Q1 to the drive signal $DRV_1$ described in the foregoing, and the other $K_1$-$N_1$ drive signals D1-DK of the electronic switch Q1 to the logic level maintaining the respective switch opened (e.g., low). Similarly, in order to close a given number $N_2$ of the electronic switches S1-SK implementing the power stage Q2, the control circuit 22 may set $N_2$ drive signals D1-DK of the power stage Q2 to the drive signal $DRV_2$ described in the foregoing, and the other $K_2$-$N_2$ drive signals D1-DK of the electronic switch Q2 to the logic level maintaining the respective switch opened (e.g., low).

In various embodiments, the power stage comprises K (physical and/or virtual) electronic switches S1-SK, which have different partitioning factors. For example, the electronic switch S1 may have a (normalized) partitioning rate of one, the electronic switch S2 may have a partitioning rate of two, the electronic switch S3 may have a partitioning rate of four and the electronic switch S4 may have a partitioning rate of eight, i.e., considering a generic electronic switch Si, the partitioning factor of the switch may be $2^{(i-1)}$. Accordingly, in this case, similar to a binary coding, the power stage Q may be partitioned into a partitioning value N selected between 1 and $(2^K-1)$, i.e., with $1 \leq N \leq (2^K-1)$. For example, assuming that the power stage comprises 4 electronic switches S1-S4, the power stage may have a partitioning value N selected between 1 and 15. Accordingly, in this case, the driver circuit of the power stage Q may determine the requested partitioning rate N and then drive the K electronic switches S1-SK in order to obtain the requested partitioning rate N.

For example, the driver circuit may drive: the electronic switch S1 in order to obtain a partitioning rate of N=1; the electronic switch S1 and S2 in order to obtain a partitioning rate of N=3; the electronic switch S3 in order to obtain a partitioning rate of N=4; and the electronic switch S1, S2, S3 and S4 in order to obtain a partitioning rate of N=15:

Thus, in various embodiments, the driver circuit may convert the requested partitioning value N into its binary representation, wherein each bit of the binary value (having K bits) indicates whether a respective electronic switch S1-SK should be driven/enabled during a switching cycle. In general, also different partitioning rates may be used for the electronic switches S1-SK.

Thus, in general, the driver circuit may first determine a requested partitioning value N, which may be selected in a range between a minimum value $N_{min}$ (corresponding to the partitioning factor of the switch with the smallest partitioning factor, e.g., a (normalized) partitioning value of one), and a maximum value $N_{max}$ (corresponding to the partitioning value when all switches S1-SK are driven/enabled), and then drive the K electronic switches as a function of the requested partitioning value N and the partitioning rates of the electronic switches S1-SK in order to obtain the requested partitioning value N.

As will be described in greater detail in the following, in various embodiments, the control circuit 22 may thus determine for each power stage Q1 and Q2 a respective requested partitioning value N as a function of the (total) current flowing through the respective power stage. For example, the current $I_{Q1}$ flowing through the power stage Q1 may be monitored via the current sensor 26*a* or a current sensor 26*b* connected in series with the power stage Q1. Similarly, the current $I_{Q2}$ flowing through the power stage Q2 may be monitored via the current sensor 26*a* or the current sensor 26*c*.

Similar issues exist also in other electronic converters, or in general, in case a variable current may flow through a power stage Q.

Figure 7:
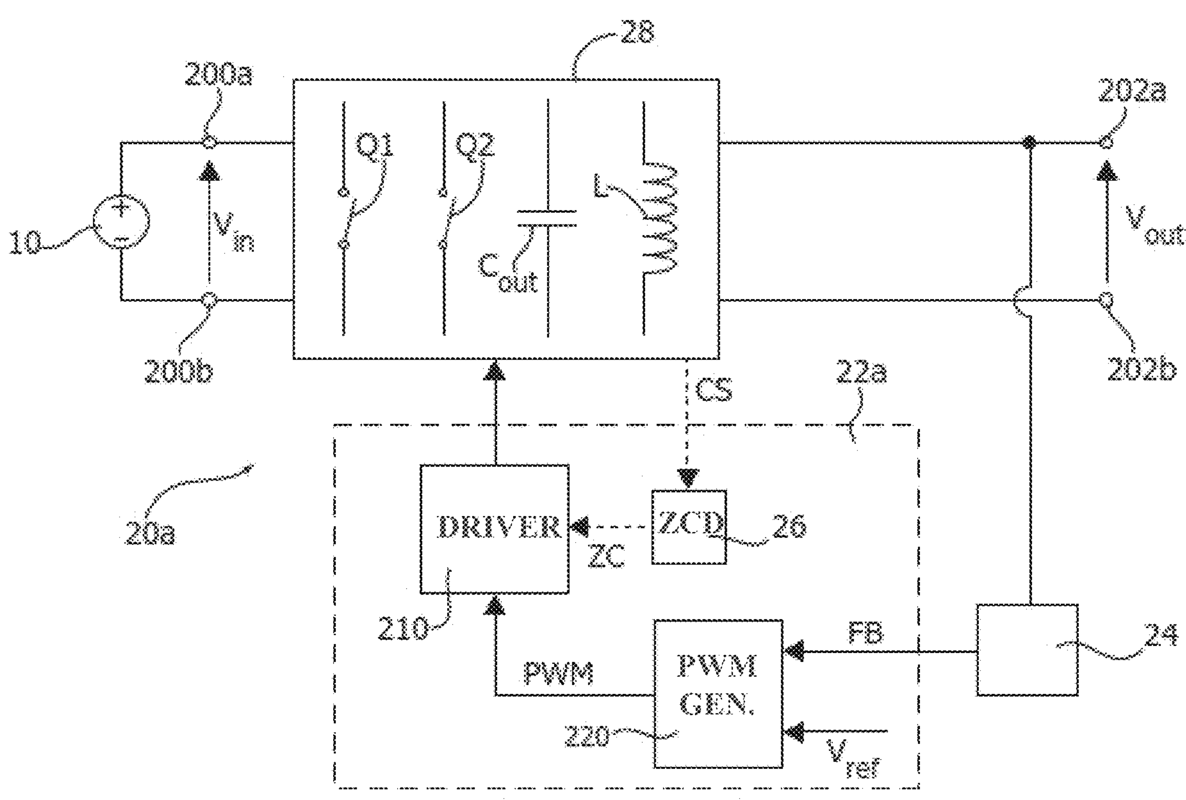
FIGS. 7 and 8 show an embodiment of a generic electronic converter.

For example, FIG. 7 shows a generic electronic converter. Specifically, in the embodiment considered, the electronic converter 20*a* comprises a switching stage/circuit 28 connected between input terminals 200*a*, 200*b* and output terminal 202*a*, 202*b*. Such a switching stage 28 comprises one or more reactive components, such as the inductance L and/or the capacitance $C_{out}$, and one or more electronic switches, such as Q1 and Q2, configured to selectively transfer energy from the input terminal 200*a* and 200*b* to the one or more reactive components and/or from the one or more reactive components to the output terminals 202*a* and 202*b*.

Specifically, also in this case, the electronic converter comprises a control circuit 22*a* configured to generate for each of the electronic switches Q1 and Q2 a respective drive signal, such as drive signals $DRV_1$ and $DRV_2$. For example, typically the control circuit 22*a* is configured to generate the drive signals as a function of a feedback signal FB provided by a feedback circuit 24, wherein the feedback signal FB is indicative of the output voltage $V_{out}$ (in case of a regulated voltage generator) or the output current $I_{out}$ (in case of a regulated current generator). For example, this is schematically shown via a PWM generator (PWM Gen.) circuit 220 configured to generate a PWM signal (PWM). For example, the circuit 220 may be an analog and/or digital PI or PID regulator configured to vary the switch-on duration of the signal DRV, or more generally the duty-cycle, in order to regulate the difference between the reference signal $V_{ref}$ and the feedback signal FB to zero.

For example, when using CCM, a driver circuit 210 may be configured to detect-rising and falling edges in the drive signal PWM and: in response to a rising edge in the drive signal PWM, set (e.g., immediately) the signal $DRV_2$ for the electronic switch Q2 to low and set (e.g., after a first dead time) the signal $DRV_1$ for the electronic switch Q1 to high; and in response to a falling edge in the drive signal PWM, set (e.g., immediately) the signal $DRV_1$ to low and set (e.g., after a second dead time) the signal $DRV_2$ to high.

Conversely, when using DCM, the driver circuit 210 may also receive a zero current signal ZC from a zero current detector (ZCD) circuit 26 configured to monitor a signal CS indicative of the current flowing through the inductance L. For example, in this case, the driver circuit 210 may be configured to detect rising and falling edges in the drive signal DRV and: in response to arising edge in the drive signal PWM, set (e.g., immediately or after a first dead time) the signal $DRV_1$ for the electronic switch Q1 to high; in response to a falling edge in the drive signal PWM, set (e.g., immediately) the signal $DRV_1$ to low and set (e.g., after a second dead time) the signal $DRV_2$ to high; and in response to detecting that the current flowing through the inductance L reaches zero, set (e.g., immediately) the signal $DRV_2$ to low.

However, also other a different number of electronic switches Q1 and Q2 and/or different driving schemes may be used. In fact, as will be described in greater detail in the following, it is sufficient that each electronic switch Q1 and Q2 receives a respective drive signal, which is used to switch the respective electronic on (when the respective drive signal has a first logic level/is asserted) and off (when the respective drive signal has a second logic level/is de-asserted).

Figure 8:
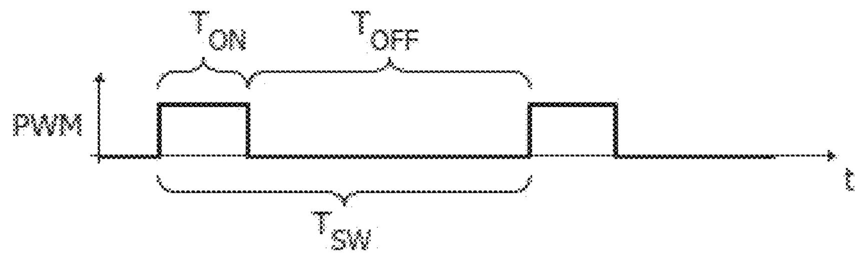

For example, as described in the foregoing, in various embodiments, each drive signal is a PWM signal. For example, as also shown in FIG. 8, a PWM signal has switching cycles $T_{SW}$ (e.g., with fixed, predetermined or variable period) wherein the signal PWM is asserted/set to a first logic level (e.g., high) for a first duration $T_{ON}$ for closing the respective electronic switch and de-asserted/set to a second logic level (e.g., low) for a second duration $T_{OFF}$ for opening the respective electronic switch, with $T_{SW}=T_{ON}+T_{OFF}$. Typically, the various drive signals have the same period $T_{SW}$. For example, with respect to FIGS. 5A and 5B, the switch on duration $T_{ON}$ corresponds to $T_1$ for the drive signal $DRV_1$ and $T_2$ for the drive signal $DRV_2$, and both drive signals $DRV_1$ and $DRV_2$ have the same switching period $T_{SW}$.

Accordingly, also in this case, at least one of the electronic switches Q1 and Q2 may implemented with a power stage Q comprising a plurality of K (physical and/or virtual) electronic switches connected in parallel, in particular FETs, wherein each of the K electronic switches receives a respective drive signal D1-DK. Accordingly, in the embodiment considered, the driver circuit of the power stage Q, e.g., the driver circuit 210, is configured to generate the drive signals D1-DK for each of the power stages Q1 and Q2.

As mentioned before, various embodiments of the present disclosure relate to solutions for selecting the partitioning value N of a power stage Q comprising K (physical and/or virtual) electronic switches, in particular FETs, and the respective electronic switches to be driven/enabled during a given switching cycle $T_{SW}$.

As indicated in the foregoing, the losses of a Field-Effect Transistor derive mainly from the Ohmic losses and the dynamic losses. For example, as also disclosed in document George Lakkas, "MOSFET power losses and how they affect power-supply efficiency", 2016, Texas Instruments, incorporated herein by reference, the power losses $P_{FET}$ of a FET driven via a PWM signal may be approximated by the following equation comprising the conduction losses and the driving losses:

$$P_{FET} = Q_g(V_{gs})V_{gs}f_{sw} + I_{rms}^2\ R_{ds,ON}(V_{gs}) \tag{1}$$

where $Q_g(V_{gs})$ is the gate charge, which depends on the gate-source voltage $V_{gs}$, $f_{sw}=1/T_{SW}$ is the switching frequency, $I_{rms}$ is the root-mean-square (RMS) current flowing through the FET, and $R_{ds,ON}(V_{gs})$ is the switch-on resistance of the FET, which depends on the gate-source voltage $V_{gs}$.

Accordingly, when driving a given number N of parallel connected FETs, the gate charge and thus the dynamic losses increase proportionally, and the switch-on resistance and thus the Ohmic losses decrease proportionally, i.e., the total losses $P_{tossCD}$ of the power stage Q are:

$$P_{lossCD} = NQ_g(V_{gs})V_{gs}f_{sw} + I_{rms}^2 R_{ds,ON}(V_{gs})/N \tag{2}$$

where the first term corresponds to the driving losses $P_{lossD}$ and the second term the conduction losses $P_{lossC}$.

Accordingly, in order to determine the optimal value $N_{opt}$ of the partitioning value N of a given power stage Q, the derivative of equation (2) may be calculated, determining the condition when the derivative is zero, i.e.:

$$dP_{lossCD}/dN = Q_g(V_{gs})V_{gs}f_{sw} - I_{rms}^2 R_{ds,ON}(V_{gs})/N^2 = 0 \tag{3}$$

which can be rewritten as:

$$N_{opt}Q_g(V_{gs})V_{gs}f_{sw} = \frac{I_{rms}^2 R_{ds,ON}(V_{gs})}{N_{opt}} \tag{4}$$

Indeed, the power losses $P_{FET}$ of a FET comprise not only the driving losses, but also the switching losses. However, it is noted that the switching losses of a power stage are rather independent from the number of electronic switches which are closed for the power stage. Accordingly, for a given operation condition, these losses essentially represent a constant in equation (1) and are removed when calculating the derivative.

Figure 9:
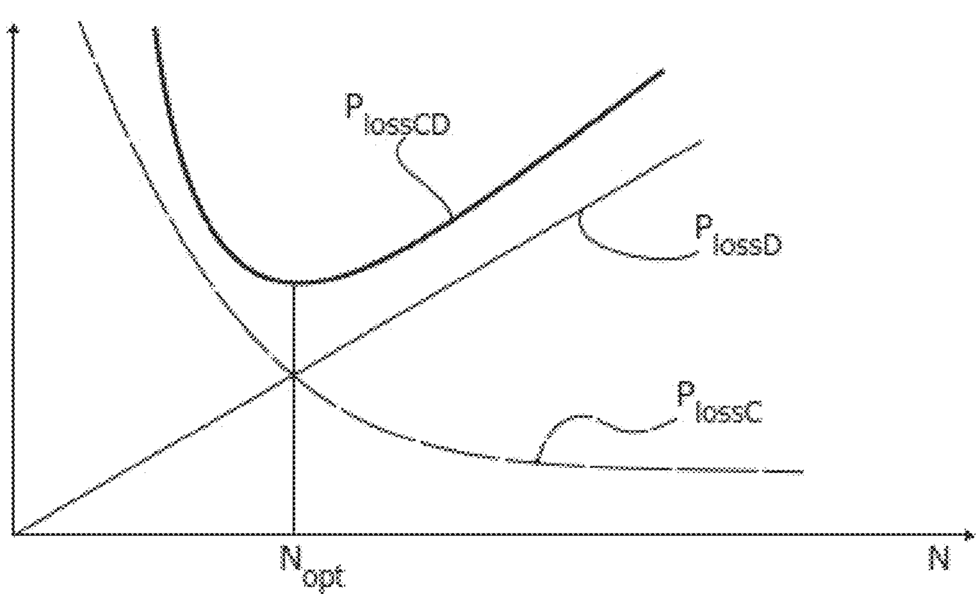
FIG. 9 shows the power losses of a power stage with switch partitioning.

For example, FIG. 9 shows the relationship of the driving losses $P_{lossD}$, the conduction losses $P_{lossC}$ and the total losses $P_{lossCD}$ as a function of the partitioning value N of the power stage Q, which also indicates the minimum value for the losses $P_{lossCD}$ for the optimal partitioning value $N_{opt}$.

Specifically, in view of equation (4), the minimum loss condition for a given FET is reached, when the driving losses of the FET are equal to the conduction losses of the FET, irrespective of the number of FETs turned on during the switching cycle $T_{SW}$, i.e.:

$$Q_g(V_{gs})V_{gs}f_{sw} = I_{rms}^2 R_{ds,ON}(V_{gs}) \tag{5}$$

Based on equation (5), it is possible to determine the optimal value $I_{rms_{opt}}$ of the RMS load current at which a given reference FET of the power stage Q operates with minimum losses:

$$I_{rms_{opt}} = \sqrt{\frac{Q_g(V_{gs})V_{gs}f_{sw}}{R_{ds,ON}(V_{gs})}} \tag{6}$$

Accordingly, in various embodiments, the driver circuit may determine the partitioning value N as a function of the RMS value $I_{Q,rms}$ of the (total) current $I_Q$ flowing through the power stage, the optimal value $I_{rms_{opt}}$ for the reference FET and the partitioning factor of the reference FET. For example, in various embodiments, the reference FET corresponds to the FET with the smallest partitioning factor, which is associated with a normalized partitioning factor of one. Accordingly, in this case, the optimal partitioning value may be calculated as:

$$N_{opt} = \frac{I_{Q,rms}}{I_{rms_{opt}}} \tag{7}$$

For example, in various embodiments, the driver circuit of the power stage Q is configured to calculate for each partitioning rate N respective threshold values for the RMS value $I_{Q,rms}$ as a function of the value $I_{rms_{opt}}$.

Figure 10:
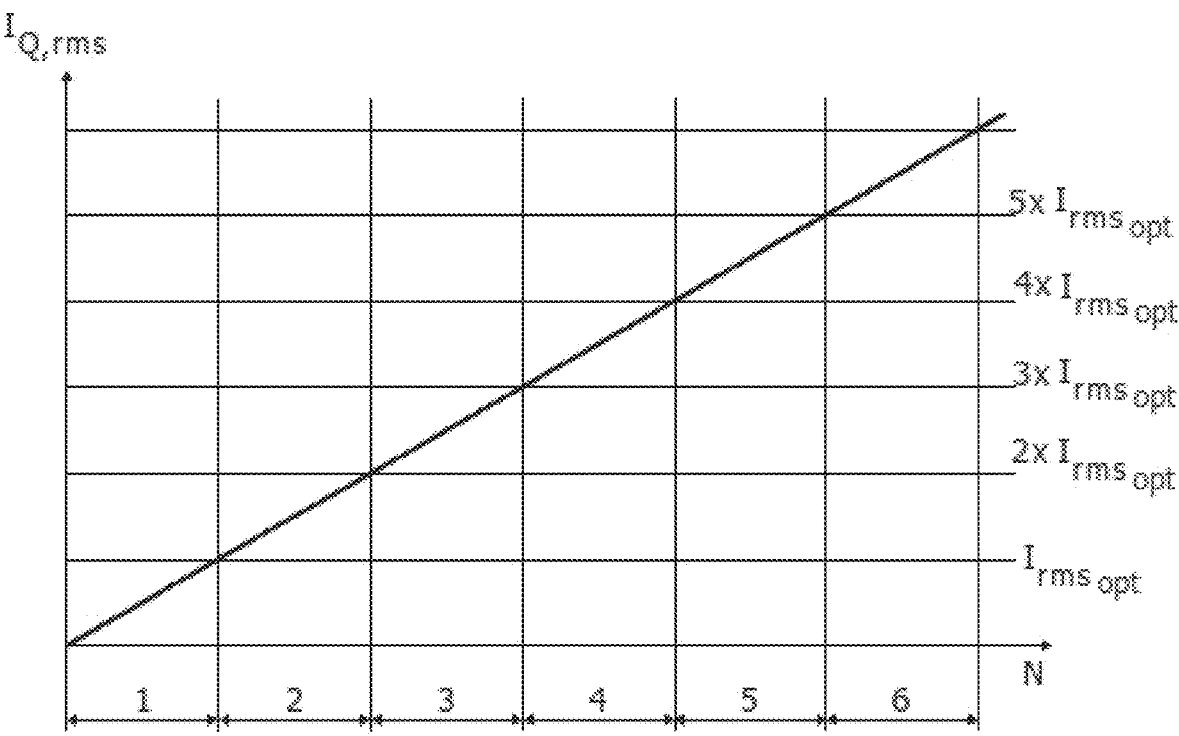
FIG. 10 shows an embodiment for selecting a partitioning value for a power stage.

For example, FIG. 10 shows an embodiment, wherein the driver circuit of the power stage Q is configured to: select the partitioning value N=1, when the RMS value $I_{Q,rms}$ of the current flowing through the power stage is between 0 and $I_{rms_{opt}}$; select the partitioning value N=2 FET, when the RMS value $I_{Q,rms}$ of the current flowing through the power stage is between $I_{rms_{opt}}$ and $2 \cdot I_{rms_{opt}}$; and select the partitioning value N=3 FET, when the RMS value $I_{Q,rms}$ of the current flowing through the power stage is between $2 \cdot I_{rms_{opt}}$ and $3 \cdot I_{rms_{opt}}$; etc.

In this respect, document Dusan Graovac, Marco Purschel, Andreas Kiep, "MOSFET Power Losses Calculation Using the DataSheet Parameters", Application Note, V 1.1, July 2006, Infineon Technologies AG, incorporated herein by reference, or the webpage "Root mean square" of Wikipedia®, incorporated herein by reference, disclose how to calculate the RMS value for different waveforms. Moreover, the document by Dusan Graovac noted above explicitly refers to the current flowing through a FET, also in the context of typical electronic converters.

For example, as mentioned before, in various embodiments, the drive signal of the power stage Q is a PWM signal having a given switch-on period $T_{ON}$ and switch-off period $T_{OFF}$. In this case the RMS value $I_{rms}$ may be calculated according to the following equation:

$$I_{rms}^2 = \frac{T_{ON}}{T_{SW}} I_{rms,ON}^2 + \frac{T_{OFF}}{T_{SW}} I_{rms,OFF}^2 \tag{8}$$

where $I_{rms,ON}$ is the root-mean-square (RMS) current flowing through the FET during the switch-on period $T_{ON}$, $I_{rms,OFF}$ is the root-mean-square (RMS) current flowing through the FET during the switch-off period $T_{OFF}$. Accordingly, since the current flowing through a FET is approximately zero during the switch-off period $T_{OFF}$, equation (8) may be simplified as:

$$I_{rms}^2 = \frac{T_{ON}}{T_{SW}} I_{rms,ON}^2 = D \cdot I_{rms,ON}^2 \tag{9}$$

where $D=T_{ON}/T_{SW}$ is the duty-cycle.

Accordingly, in various embodiments, the driver circuit of the power stage Q may determine, in line with equations (6) and (9) the optimal RMS value $I_{rms,ON_{opt}}$ for the current flowing through the reference FET during the switch-on interval $T_{ON}$.

$$I_{rms,ON_{opt}} = \frac{I_{rms_{opt}}}{\sqrt{D}} = \sqrt{\frac{Q_g(V_{gs})V_{gs}f_{sw}}{DR_{ds,ON}(V_{gs})}} \tag{10}$$

Next, the driver circuit of the power stage Q obtains, e.g., measures or calculates, the RMS value $I_{Q,rms,ON}$ for the current $I_Q$ flowing through the power stage Q during the switch-on period $T_{ON}$ and determines the partitioning value, similar to equation (7), as a function of the RMS value $I_{rms,ON_{opt}}$. For example, assuming again that the reference FET corresponds to the FET with a partitioning factor of one, the optimal partitioning value $N_{opt}$ may be determined as:

$$N_{opt} = \frac{I_{Q,rms,ON}}{I_{rms,ON_{opt}}} \tag{11}$$

For example, in various embodiments, the driver circuit of the power stage Q is configured to determine for each partitioning rate N respective threshold values for the RMS value $I_{Q,rms,ON}$ as a function of the value $I_{rms,ON_{opt}}$.

In this respect, assuming that the current flowing through the power stage Q is constant during the switch-on period $T_{ON}$, i.e., the current $I_Q$ corresponds to a square-wave current switching between $I_{Q,max}$ and zero, the driver circuit may calculate the RMS value $I_{Q,rms,ON}$ according to the following equation:

$$I_{Q,rms,ON} = I_{Q,max}, \text{ i.e., } I_{Q,max} = I_{Q,rms,ON} \tag{12}$$

Conversely, in an electronic converter, the current $I_Q$ usually either increases or decreases substantially linearly during the switch-on period $T_{ON}$. In this case, the driver circuit may calculate the RMS value $I_{Q,rms}$ according to the following equation:

$$I_{Q,rms,ON} = \sqrt{\left(\frac{I_{Q,max}^2}{3} + I_{Q,min}^2\right)} \tag{13}$$

where $I_{Q,max}$ corresponds to the maximum/peak value of the (increasing or decreasing) ramp and $I_{Q,min}$ corresponds to the minimum value of the (increasing or decreasing) ramp. For example, with a DCM or TM control, the minimum current $I_{Q,min}$ is usually zero, and equation (13) may be simplified as follows:

$$I_{Q,rms,ON} = \frac{1}{\sqrt{3}} \cdot I_{Q,max}, \text{ i.e., } I_{Q,max} = \sqrt{3} \cdot I_{Q,rms,ON} \tag{14}$$

Accordingly, e.g., in line with equations (12) or (14), in various embodiments, the driver circuit may obtain, e.g., measure or calculate, the peak value $I_{Q,max}$ of the current $I_Q$ during the switch-on period $T_{ON}$ and determine threshold values for the peak value $I_{Q,max}$ as a function of an optimal value $I_{rms,ON_{opt}}$. For example, assuming again that the reference. FET corresponds to the FET with a partitioning factor of one and a square-wave current $I_Q$, the driver circuit may determine the optimal partitioning value $N_{opt}$ according to equation (11):

$$N_{opt} = \frac{I_{Q,rms,ON}}{I_{rms,ON_{opt}}} = \frac{I_{Q,max}}{I_{rms,ON_{opt}}} \tag{15}$$

For example, in various embodiments, irrespective of the specific current profile of the current $I_Q$, the driver circuit uses equation (12)

as simplification (worst case scenario), i.e., $I_{Q,rms,ON}=I_{Q,max}$. For example, similar to what has been described in the foregoing, the driver circuit of the power stage Q may select a given partitioning value N, when the peak value $I_{Q,max}$ of the (total) current flowing through the power stage Q is between $(N-1)\cdot I_{rms,ON_{opt}}$ and $N\cdot I_{rms,ON_{opt}}$, or alternatively between $(N-0.5)\, I_{rms,ON_{opt}}$ and $(N+0.5)\cdot I_{rms,ON_{opt}}$, with N being at least 1. In general, also other solutions may be used to determine the thresholds as a function of the value $I_{rms,ONopt}$. For example, the driver circuit of the power stage Q may activate a given number N of FETs when the peak value $I_{Q,max}$ of the (total) current flowing through the power stage Q is between $(N-m)\cdot I_{rms,ON_{opt}}$ and $(N+1-m)\cdot I_{rms,ON_{opt}}$, with $0<m\leq 1$ and N being at least 1.

In various embodiments, instead of using directly the value $I_{Q,rms,ON}$ or a value proportional to the value $I_{Q,rms,ON}$, such as $I_{Q,max}$ for a square wave or sawtooth current profile, the driver circuit may determine (as approximation) the partitioning value N also as a function of other values being indicative of the current $I_Q$, such as the average value $\bar{I}_{Q,ON}$ of the current $I_Q$ during the switch on period $T_{ON}$.

Accordingly, in various embodiments, as shown in equation (10), the driver circuit of the power stage Q is configured to determine the (optimal) value of the optimal RMS $I_{rms,ON_{opt}}$ for the reference FET of the power stage, wherein the RMS value $I_{rms,ON_{opt}}$ depends on the current operating condition of the reference FET. For example, as shown in equation (10), the value $I_{rms,ON_{opt}}$ depends at least on the gate-source voltage $V_{gs}$, the switching frequency $f_{sw}$ and the duty-cycle D. Moreover, while not shown in equations (6) and (10) the optimal value also depends on aging, process and temperature variations, which may influence the charge $Q_g$ and the switch-on resistance $R_{ds,ON}$.

In the following will now be described embodiments of circuits configured to generate a first signal indicative of the driving losses $Q_9(V_{gs})V_{gs}f_{sw}$ and/or a second signal indicative of the conduction losses $DR_{ds}(V_{gs})$.

Figure 11:
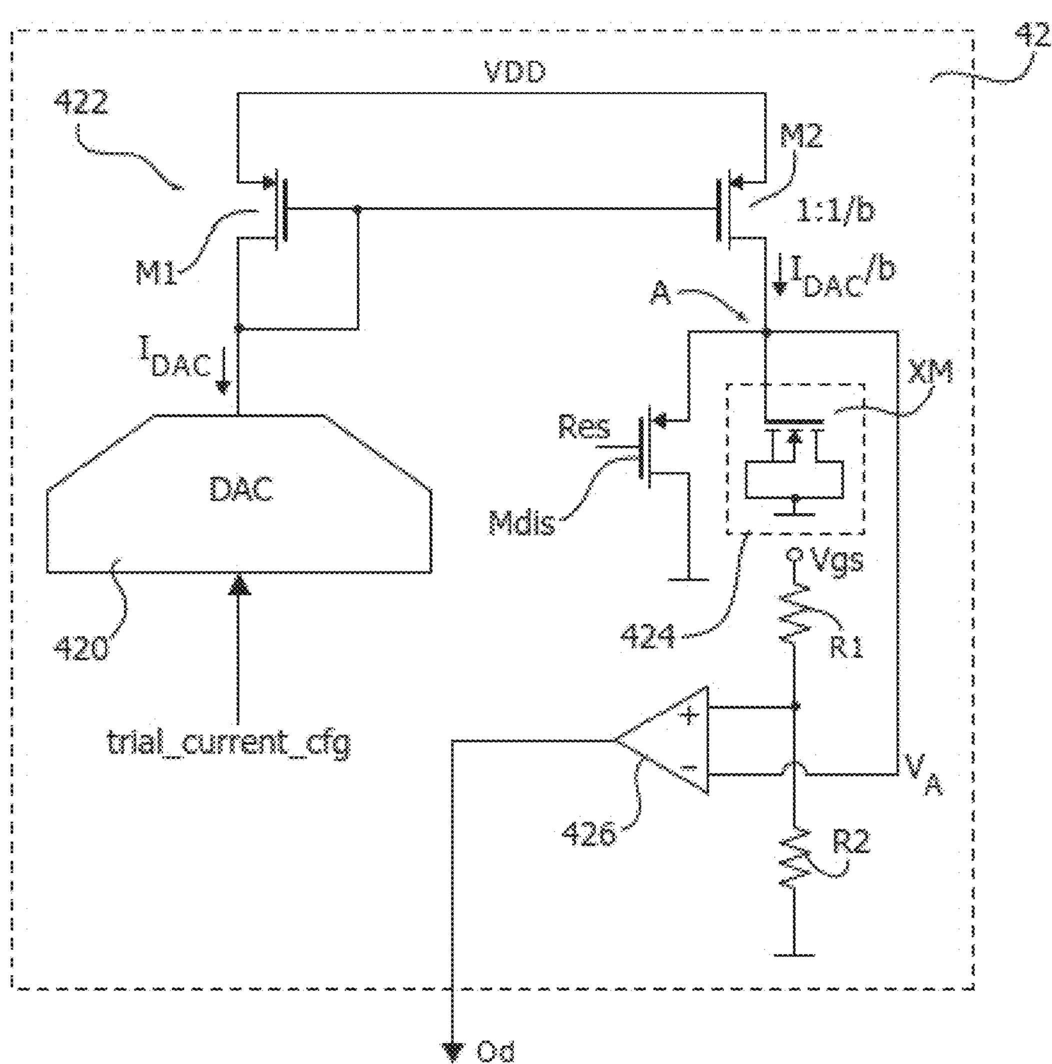
FIGS. 11 and 12 show an embodiment of a circuit configured to generate a signal indicative of the driving losses of a FET.

For example, FIG. 11 shows an embodiment of a circuit 42 configured to generate a signal indicative of the driving losses. As mentioned before, each power stage Q comprises a plurality of K (physical and/or virtual) parallel connected FETs, which essentially have the same production properties, e.g., because the FETs are implemented with the same production process. However, the FETs may have different dimensions in order to implement different partitioning factor, e.g., the FETs may have different channel widths. Moreover, the power stage receives a PWM signal, which is selectively forwarded to a given number of enabled FETs in order to implement a given selected partitioning value N.

In this respect, the driving loss estimation circuit 42 is configured to generate a signal indicative of the term $Q(V_{gs})\cdot f_{sw}\cdot V_{gs}$. For this purpose, in the embodiment considered, the circuit 42 comprises a capacitance 424. Specifically, in the embodiment considered, the capacitance 424 is used to emulate the capacitances associated with the gate node of the reference FET of the power stage Q. For example, in the embodiment considered, the capacitance 424 is implemented with a FET XM, such as a n-channel MOSFET, which represents a scaled version of the reference FET. For example, in the embodiment considered, the source and drain nodes of the FET XM are connected (e.g., directly) to ground. The drain terminal could also be connected to another reference voltage, but short-circuiting the drain and source terminals of the FET XM ensures that no additional losses are generated due to a current flowing between the source and drain terminals of the FET XM. In general, instead of using a single FET XM, the capacitance 424 may also comprise a plurality of FETs XM, wherein the gate terminals are connected to a common node.

Accordingly, in the embodiment considered, the capacitance 422 has a value corresponding to $C_{XM}=a\cdot C_{copy}$, where a is the scaling factor between the FET(s) XM and the reference FET, and $C_{copy}$ represent the value of the gate capacitance of a FET being an exact copy of the reference FET (without scaling). Accordingly, the capacitance $C_{XM}$ corresponds to a value comprising a scaled value of the gate-source and gate-drain capacitances of the reference FET. In this respect, by implementing the FET(s) XM as a scaled copy of the reference FET, the FET(s) XM will also be subject to the same process variations. Moreover, by placing the FET(s) XM in close vicinity of the reference FET, e.g., in vicinity within the same integrated circuit, the FET(s) XM will (approximately) be subject to the same temperature variations and/or aging of the reference FET.

In the embodiment considered, the circuit 42 comprises also a current digital-to-analog converter (DAC) 420 configured to generate a current $I_{DAC}$, which is provided to the gate node of the FET(s) XM, indicated also as node A. For example, in the embodiment considered, the DAC 420 generates the current $I_{DAC}$ as a function of a digital signal trial_current_cfg, which will be described in greater detail in the following.

In various embodiments, the DAC 420 does not provide the current $I_{DAC}$ directly to the gate node A of the FET XM, but an additional current mirror 422 is used to apply a current $I_{DAC}/b$ to the gate node A of the FET XM, wherein the current $I_{DAC}/b$ is proportional to the current $I_{DAC}$ according to a given mirroring factor b of the current mirror 422. For example, in the embodiment considered, the current mirror 422 is implemented with p-channel FETs M1 and M2, such as MOSFETS, supplied via a voltage VDD, wherein the input transistor M1 of the current mirror 422 receives the current $I_{DAC}$ and the output transistor M2 of the current mirror 422 provides the current $I_{DAC}/b$, which is fed to the gate node A. Accordingly, the current $I_{DAC}/b$ is fed to the node A and charges the capacitances associated with the node A.

In the embodiment considered, the circuit 42 comprises also an electronic switch Mdis configured to selectively discharge the capacitance 424 as a function of a reset signal Res. For example, in the embodiment considered, the electronic switch Mdis is a n-channel FET, wherein the drain node is connected to the node A, the source node is connected to the source node of the FET XM, i.e., ground, and the gate node receives the signal Res. Accordingly, in various embodiments, when the signal Res is asserted, e.g., set to high, the node A is connected to ground via the electronic switch Mdis and the capacitance 422 is discharged. Conversely, when the signal Res is de-asserted, e.g., set to low, the electronic switch Mdis is opened and the current $I_{DAC}$ or in general $I_{DAC}/b$ charges the capacitance 422, thereby generating a ramp signal at the node-A.

In the embodiment considered, the voltage $V_A$ at the node A is fed to a comparator 426 configured to compare the voltage $V_A$ with a threshold voltage. Specifically, in various embodiments, the threshold voltage is proportional to the gate-source voltage $V_{gs}$ used to drive the reference FET of the power stage Q, i.e., $V_{gs}/c$. For example, in the embodiment considered, the threshold voltage $V_{gs}/c$ is obtained via a voltage divider comprising two resistors R1 and R2 connected in series between the voltage $V_{gs}$ and ground, whereby the intermediate node between the resistors R1 and R2 provides a scaled voltage $V_{gs}/c$ based on the resistances of the resistors R1 and R2. Specifically, in the embodiment considered, the comparator 426 is configured to assert, e.g., set to high, a signal Od, in response to determining that the voltage $V_A$ is smaller than the threshold voltage $V_{gs}/c$, and de-assert, e.g., set to low, the signal Od, in response to determining that the voltage $V_A$ is (equal to or) greater than the threshold voltage $V_{gs}/c$.

For example, this implies that the signal Od is initially asserted and, once the voltage $V_A$ reaches the threshold voltage $V_{gs}/c$, the signal Od is de-asserted. For example, this also implies that the voltage $V_A$ never reaches the threshold voltage $V_{gs}/c$ when the current $I_{DAC}$ is too small, whereby the signal would have a duty-cycle of 100%. Accordingly, when increasing the value of the current $I_{DAC}$, the duty-cycle $D_{Od}$ is reduced.

Figure 12:
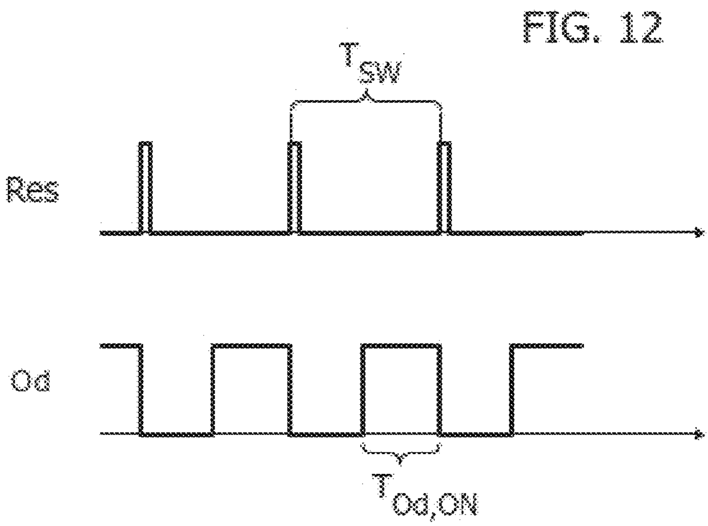

In various embodiments, as shown in FIG. 12, the signal Res corresponds to a trigger signal, which is asserted for a brief time interval at the beginning of each switching period $T_{SW}$ of the reference FET. For example, the signal Res may be generated via an edge detector, such as a monostable circuit, configured to monitor the PWM drive signal used to drive the power stage Q, or the signal Res may be provided directly by the circuit generating the PWM drive signal.

Accordingly, the circuit 42 shown in FIG. 11 is configured to generate a signal Od having a duty-cycle $D_{Od}$ determined as a function of the current $I_{DAC}$, the gate capacitances $C_{XM}$ of the scaled FET XM and the gate-source voltage $V_{gs}$.

Specifically, in the embodiment considered, when the voltage $V_A$ at the node A reaches the threshold voltage $V_{gs}/c$, the following relation applies:

$$\frac{\frac{I_{DAC}}{b}}{(a\cdot C_{copy})}=\frac{V_{gs}}{c} \tag{16}$$

Conversely, the duty-cycle $D_{Od}$ of the signal Od may be written as:

$$D_{Od}=\frac{V_{gs}}{c}\cdot\frac{(a\cdot C_{copy})}{\frac{I_{DAC}}{b}}\cdot f_{sw} \tag{17}$$

with $D_{Od}=T_{Od,ON}/T_{SW}$, where $T_{Od,ON}$ corresponds to the on-time when the signal Od is asserted, which may be written as:

$$D_{Od}=(Q(V_{gs})\cdot f_{sw}\cdot V_{gs})\cdot\frac{1}{V_{gs}}\cdot\frac{(a\cdot b)}{c}\cdot\frac{1}{I_{DAC}} \tag{18}$$

where $Q(V_{gs})=C_{copy}\cdot V_{gs}$ corresponds to the gate charge of an unscaled copy of the reference FET of the power stage Q.

Accordingly, the term $(a\cdot b)/c$ represents a (constant) scaling factor of the circuit 42, and for a given current $I_{DAC}$, as specified via the signal trial_current_cfg, the circuit 42 generates a signal Od having a duty-cycle $D_{Od}$ being proportional to the driving losses of the reference FET of the power stage Q, and inversely proportional to the applied current $I_{DAC}$ and the gate-source voltage $V_{gs}$.

Accordingly, in the embodiments considered, the circuit 42 is configured to charge a scaled capacitance 424 via a current $I_{DAC}/b$ and de-assert the signal Od in response to determining that the voltage $V_A$ at the capacitance 424 reaches a threshold value being proportional to the gate-source voltage $V_{gs}$. Moreover, the circuit resets the charge of the capacitance 424 once each switching period $T_{SW}$, whereby the signal Od is a PWM signal, with a switching period $T_{SW}$. In various embodiments, the circuit may reset the capacitance 424 also after a plurality of switching periods $T_{SW}$, whereby an additional scaling factor would be added to equation (18).

Figure 13:
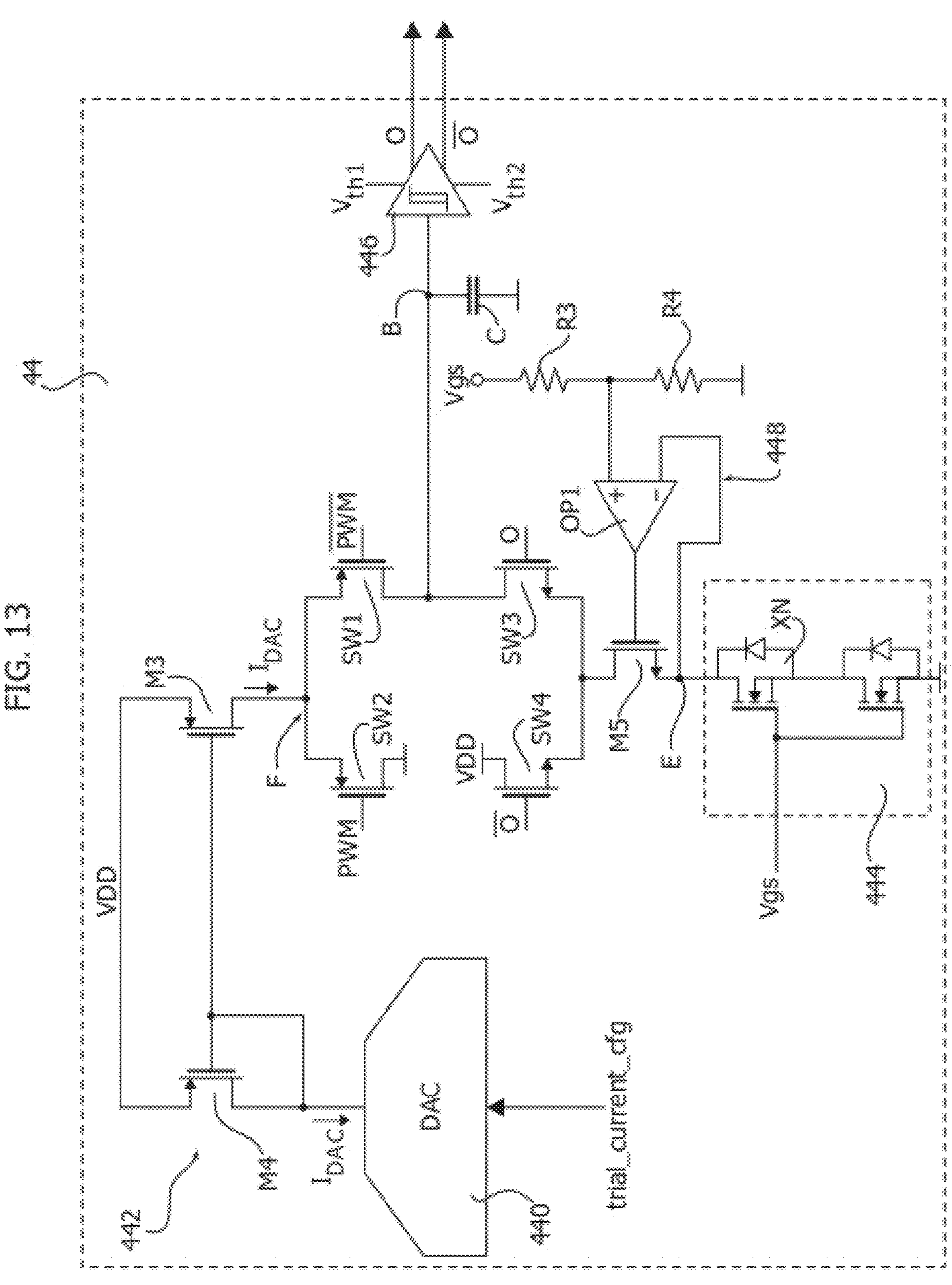
FIG. 13 shows an embodiment of a circuit configured to generate a signal indicative of the conduction losses of a FET.

FIG. 13 shows an embodiment of a circuit 44 configured to generate a signal indicative of the conduction losses. Specifically, the conduction loss estimation circuit 44 is configured to generate a signal indicative of the term $DR_{ds,ON}(V_{gs})$. For this purpose, in the embodiment considered, the circuit 44 comprises a resistance 444. Specifically, in the embodiment considered, the resistance 444 is used to emulate the switch-on resistance $R_{ds,ON}$ of the reference FET of the power stage Q. For example, in the embodiment considered, the resistance 444 is implemented with a FET XN, such as a n-channel MOSFETs, wherein the FET XN represents a scaled version of the reference FET, and wherein the gate terminal of the FET XN is driven via the gate-source voltage $V_{gs}$ of the reference FET. In general, instead of using a single FET XN, the resistance 444 may also comprise a plurality of FETs XN connected in series. For example, in the embodiment considered, the drain node of the FET XN (or a first FET XN) is connected to a node E and the source node of the FET XN (or a last FET XN) is connected to ground.

Accordingly, in the embodiment considered, the resistance 442 has a value corresponding to $R_{XN}=d\cdot R_{copy}$, where d is the scaling factor, and $R_{copy}$ represent the value of the switch-on resistance of a FET being an exact copy of the reference FET (without scaling). Accordingly, the resistance $R_{XN}$ is proportional to the switch-on resistance $R_{ds,ON}$ of the reference FET. In this respect, by implementing the FET(s) XN as a scaled copy of the reference FET, the FET(s) XN will also be subject to the same process variations. Moreover, by placing the FET(s) XN in close vicinity of the reference FET, e.g., in vicinity within the same integrated circuit, the FET(s) XN will (approximately) be subject to the same temperature variations and/or aging of the reference FET.

In the embodiment considered, the circuit 44 comprises a regulator 448 configured to apply to the node E a voltage being proportional to the gate-source voltage $V_{gs}$ applied to the reference FET, whereby the voltage $V_E$ at the node E is set to $V_{gs}/e$. For example, in the embodiment considered, the scaled gate-source voltage $V_{gs}/e$ is obtained via a voltage divider comprising two resistors R3 and R4 connected in series between the voltage $V_{gs}$ and ground, whereby the intermediate node between the resistors R3 and R4 provides a scaled voltage $V_{gs}/e$, based on the resistances of the resistors R3 and R4.

For example, in the embodiment considered, the regulator 448 comprises an operational amplifier OP1 receiving at a first input terminal, usually the inverting/negative input terminal, the voltage $V_E$ at the node E and at a second input terminal, usually the non-inverting/positive input terminal, the scaled voltage $V_{gs}/e$. Moreover, the output terminal is configured to drive a variable current generator M5, e.g., implemented via a n-channel FET, which regulates the current supplied to the node E based on the signal provided at the output of the operational amplifier OP1. Thus, essentially, the regulator 448 is configured to vary (i.e., increase or decrease) the current flowing through the current generator M5 (and the resistance 444) until the voltage VE at the node E corresponds to the scaled voltage $V_{gs}/e$. Accordingly, the regulator 448 ensures that the following current $I_{XN}$ flows through the resistance 444:

$$I_{XN} = \frac{V_{gs}}{d \cdot e \cdot R_{ds,ON}(V_{gs})} \tag{19}$$

Specifically, in the embodiment considered, the circuit 44 comprises also a DAC 440 configured to generate a current $I_{DAC}$, which is provided to a node F. For example, in the embodiment considered, the DAC 440 receives a digital signal trial_current_cfg, which will be described in greater detail in the following. Moreover, in various embodiments, the DAC 440 does not provide the current $I_{DAC}$ directly the gate node-F, but an additional (and optional) current mirror 442 is used to apply a current $I_{DAC}/f$ to the node F, wherein the current $I_{DAC}/f$ is proportional to the current $I_{DAC}$ according to a given mirroring factor f of the current mirror 422. For example, in the embodiment considered, the current mirror 442 is implemented with p-channel FETs M4 and M3, such as MOSFETs, supplied via a voltage VDD, wherein the input transistor M4 of the current mirror 442 receives the current $I_{DAC}$ and the output transistor M3 of the current mirror 442 provides the current $I_{DAC}/f$, which is fed to the node F. For example, in various embodiments the mirroring factor f is one.

In the embodiments considered, the circuit 44 comprises also a capacitance C, such as a capacitor, which may be internal or external with respect to the integrated circuit comprising the circuit 44, wherein the capacitance C is connected between a node B and ground.

Specifically, the circuit 44 comprises an electronic switch SW1 configured to selectively apply the current $I_{DAC}$ (or in general $I_{DAC}/f$) to the node B when the drive signal PWM of the power stage Q is asserted, i.e., the switch SW1 is configured to charge the capacitor C during the switch-on period $T_{ON}$ of the PWM signal used to drive the power stage Q. Optionally, the circuit 44 may comprise a further electronic switch SW2 configured to selectively apply the current $I_{DAC}$ (or in general $I_{DAC}/f$) to ground when the drive signal PWM of the power stage Q is de-asserted. Substantially, this switch is just used in order to avoid that the node F remains floating. For example, in the embodiment considered, the switches SW1 and SW2 are implemented with p-channel FETs, such as a PMOS, wherein the p-channel FET is driven via the inverted version of the signal PWM and the p-channel FET SW2 is driven via the signal PWM.

In various embodiments, the circuit 44 comprises also an electronic switch SW3 configured to selectively apply the current $I_{XN}$ flowing through the resistance 444 to the node B when a signal O is asserted, i.e., the switch SW3 is configured to discharge the capacitor C when the signal O is asserted. Optionally, the circuit 44 may also comprise a further electronic switch SW4 configured to selectively connect the regulator circuit 448 to a reference voltage, such as VDD, when the signal O is de-asserted. Substantially, this switch is just used to provide a bias for the current source M5. For example, in the embodiment considered, the switches SW3 and SW4 are implemented with n-channel FETs, such as a NMOS.

In the embodiment considered, the voltage $V_B$ at the capacitance C is provided to a comparator with hysteresis 446 configured to assert a signal O when the voltage $V_B$ reaches an upper threshold $V_{th1}$, and de-assert a signal O when the voltage $V_B$ reaches a lower threshold $V_{th2}$.

Accordingly, considering an arbitrary time interval T, the switch SW1 is closed and the current $I_{DAC}$ (or in general $I_{DAC}/f$) is applied to (in particular sourced to) the node B for a period D·T, thereby applying a given charge to the capacitor C, which results in a theoretical voltage increase of $\Delta V_1$ during the interval T.

$$\Delta V_1 = \frac{I_{DAC}}{f \cdot C} \cdot D \cdot T \tag{20}$$

However, once the voltage $V_B$ reaches the upper threshold $V_{th1}$, the comparator 446 asserts the signal O, whereby the capacitor is discharged also via the current $I_{XN}$ until the voltage $V_B$ reaches the lower threshold $V_{th2}$. Accordingly, considering the arbitrary time interval T and assuming that the switch SW3 is closed for a given duty-cycle Do, the switch SW3 is closed and the current $I_{XN}$ is applied to (in particular sunk from) the node B for a period $D_O$·T, thereby applying a given charge to the capacitor C, which results in a theoretical voltage decrease of $\Delta V_2$ during the interval T.

$$\Delta V_2 = \frac{I_{XN}}{C} D_O \cdot T = \frac{V_{gs}}{d \cdot e \cdot R_{ds,ON}(V_{gs}) \cdot C} D_O \cdot T \tag{21}$$

Accordingly, in steady state, the theoretical voltage-increase $\Delta V_1$ during the interval T should correspond to the theoretical voltage-decrease $\Delta V_2$ during the interval T, i.e.:

$$\frac{I_{DAC}}{(f \cdot C)} \cdot D \cdot T = \frac{V_{gs}}{(d \cdot e \cdot R_{ds,ON}(V_{gs}) \cdot C)} \cdot D_O \cdot T \tag{22}$$

Equation (22) may thus be used to determine the duty-cycle $D_o$ of the signal O in the steady state condition, i.e.:

$$D_O = \frac{I_{DAC}}{(f \cdot C)} \cdot D \cdot \frac{(d \cdot e \cdot R_{ds,ON}(V_{gs}) \cdot C)}{V_{gs}} \tag{23}$$

which may be written as $$D_O = \left(D \cdot R_{ds,ON}(V_{gs}) \cdot I_{DAC}^2\right) \cdot \frac{1}{I_{DAC}} \cdot \frac{(d \cdot e)}{f} \cdot \frac{1}{V_{gs}} \tag{24}$$

Accordingly, the term (d·e)/f represents a (constant) scaling factor, and for a given current $I_{DAC}$, as specified via the signal trial_current_cfg, the circuit 44 generates a signal O having a duty-cycle $D_o$ being proportional to the conduction losses of the reference FET of the power stage Q, and inversely proportional to the applied current $I_{DAC}$ and the gate-source voltage $V_{gs}$.

For example, the operation of the circuit 44 implies that the signal O is first de-asserted and, once the voltage $V_B$ reaches the upper threshold voltage of the comparator 446, the signal O is asserted. For example, this also implies that the voltage $V_B$ never reaches the upper threshold voltage when the current $I_{DAC}$ is too small, whereby the signal would have a duty-cycle of 0%. Accordingly, when increasing the value of the current $I_{DAC}$, the duty-cycle $D_O$ is increased.

Accordingly, in the embodiments considered, the circuit 44 is configured to charge during the switch-on period $T_{ON}$ via a current $I_{DAC}/f$ a capacitance C of the drive signal PWM of the power stage Q, and discharge via a current $I_{XN}$ the capacitance C when the signal O is asserted, wherein the current $I_{XN}$ is generated by applying a voltage $V_{gs}/e$ to a scaled resistance 444 and the signal O is generated via a comparator with hysteresis configured to compare the voltage $V_B$ at the capacitor with an upper threshold and a lower threshold. As shown in the foregoing, while being selected between zero and VDD, the values of the thresholds are rather irrelevant, insofar as the voltage varies between these thresholds, thereby generating the theoretical voltage variations $\Delta V_1$ and $\Delta V_2$.

Figure 14:
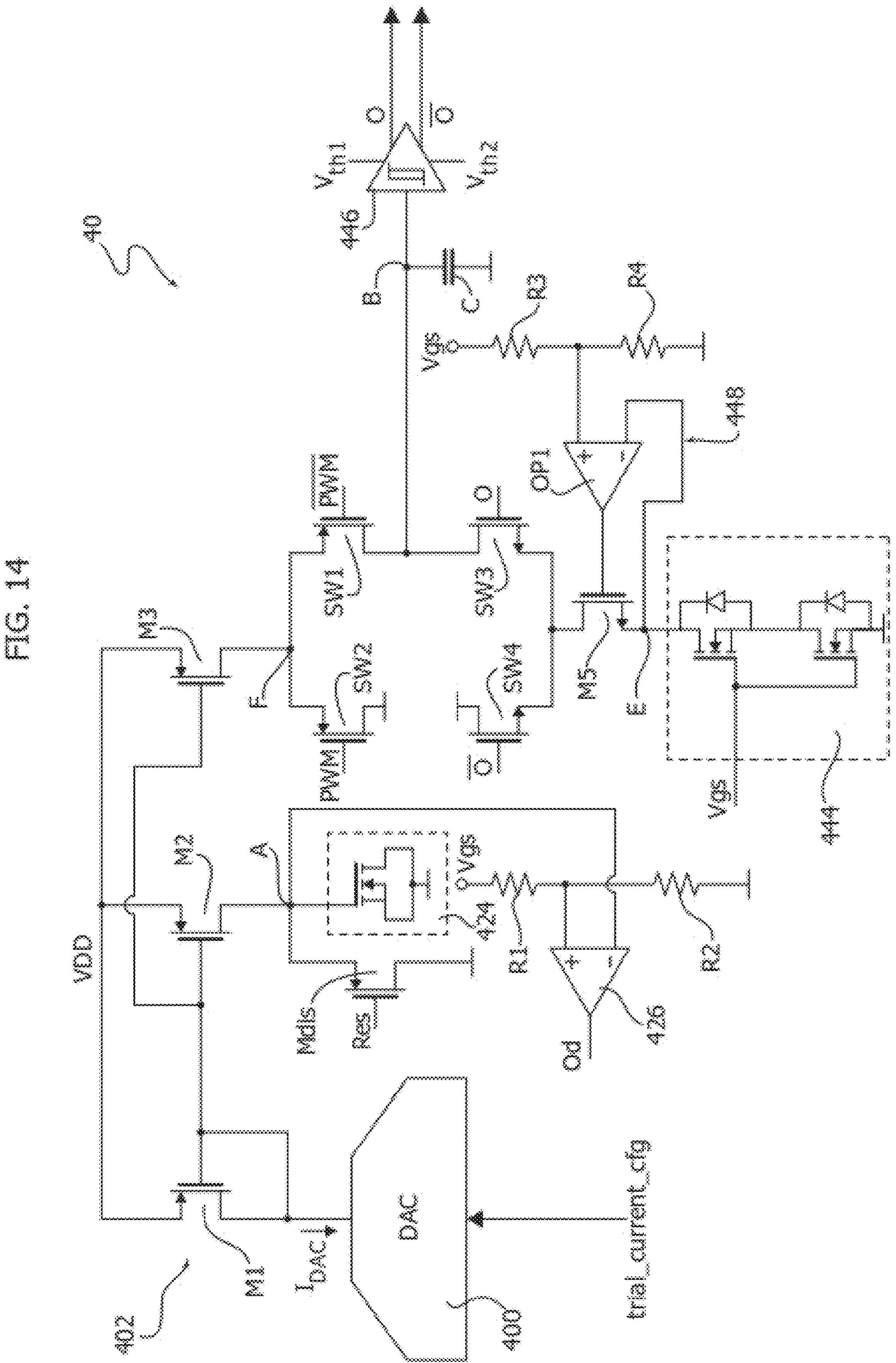
FIG. 14 shows an embodiment of a circuit comprising the circuits of FIGS. 11 and 13.

FIG. 14 shows a combined solution comprising the circuits 42 and 44 described in the foregoing. Specifically, FIG. 14 shows a circuit comprising a single current DAC 400, and a current mirror 402 receiving at an input stage M1 the current $I_{DAC}$ generated by the DAC 400 and providing via two output stages M2 and M3 the mirrored (and possibly scaled) current to the node A and the node F, respectively. Accordingly, the current mirror 402 implements the current mirrors 424 and 444 shown in FIGS. 11 and 13. For the rest, the circuit 40 comprises the other components described with respect to FIGS. 11 and 13.

By comparing equations (18) and (24), it may be observed that the optimal condition for the current $I_{DAC}$ is reached when the duty-cycle $D_{Od}$ of the signal Od corresponds to the duty-cycle $D_O$ of the signal O, i.e.:

$$(Q(V_{gs}) \cdot f_{sw} \cdot V_{gs}) \cdot \frac{1}{V_{gs}} \cdot \frac{(a \cdot b)}{c} \cdot \frac{1}{I_{DAC}} = \left(D \cdot R_{ds,ON}(V_{gs}) \cdot I_{DAC}^2\right) \cdot \frac{1}{I_{DAC}} \cdot \frac{(d \cdot e)}{f} \cdot \frac{1}{V_{gs}} \tag{25}$$

i.e.:

$$(Q(V_{gs}) \cdot f_{sw} \cdot V_{gs}) \cdot \frac{(a \cdot b)}{c} \cdot = \left(D \cdot R_{ds,ON}(V_{gs}) \cdot I_{DAC}^2\right) \cdot \frac{(d \cdot e)}{f} \tag{26}$$

More specifically, resolving equation (26) for $I_{DAC}$ provides:

$$I_{DAC} = \sqrt{\frac{(Q(V_{gs}) \cdot f_{sw} \cdot V_{gs}) \cdot \frac{(a \cdot b)}{c}}{D \cdot R_{ds,ON}(V_{gs}) \cdot \frac{(d \cdot e)}{f}}} \tag{27}$$

Accordingly, by comparing equations (10) and (27), it may be observed that the optimal condition $I_{DAC_{opt}}$ for the current $I_{DAC}$ is reached when:

$$I_{DAC_{opt}} = \frac{a \cdot b \cdot c}{d \cdot e \cdot c} \cdot I_{rms,ON_{opt}} = g \cdot I_{rms,ON_{opt}} \tag{28}$$

where g corresponds to a fixed gain, which may be set, e.g., via the capacitance scaling factor a, the mirroring rate b, the threshold scaling factor c, the resistance scaling factor d, the threshold scaling factor e and the mirroring factor f. For example, in various embodiments, the various coefficients a to f are set, such that the gain g is one, wherein the optimal value $I_{rms,ON_{opt}}$ corresponds to the optimal value $I_{DAC_{opt}}$.

Figure 15:
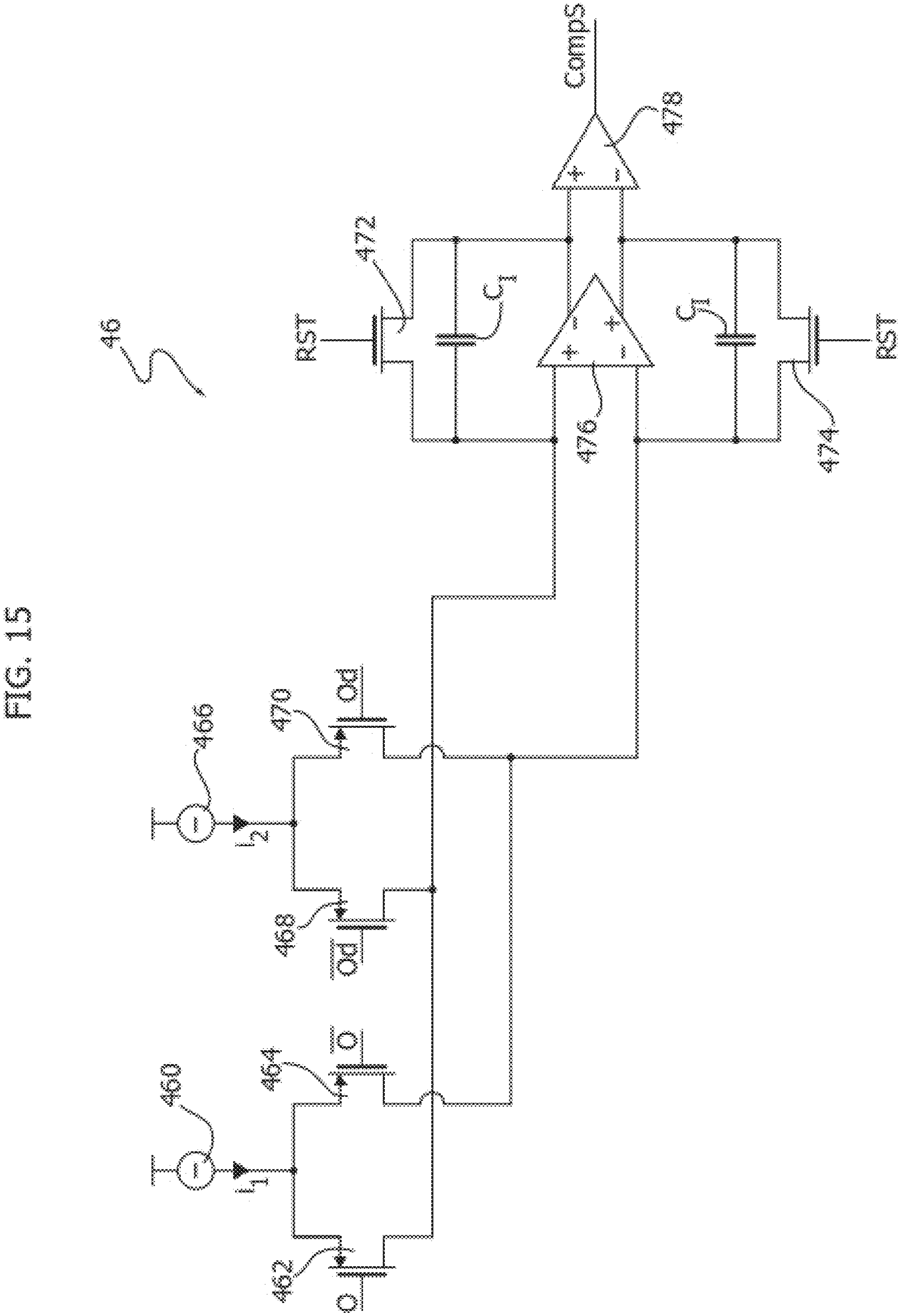
FIG. 15 shows an embodiment of a comparison circuit configured to compare the signal generated by the circuit of FIG. 13 with the signal generated by the circuit of FIG. 14.

FIG. 15 shows a possible embodiment of a circuit 46 configured to determine whether the duty-cycle $D_{Od}$ of the signal Od corresponds to the duty-cycle $D_O$ of the signal O. Specifically, in the embodiment considered, the circuit 46 comprises a differential integrator, e.g., comprising a differential operational amplifier 476, a first (integration) capacitance $C_I$ connected between a negative output terminal of the differential operational amplifier 476 and a non-inverting/positive input terminal of the differential operational amplifier 476, and a second (integration) capacitance $C_I$ connected between a positive output terminal of the differential operational amplifier 476 and a inverting/negative input terminal of the differential operational amplifier 476. Moreover, the differential integrator comprises means for resetting/discharging the capacitances $C_I$, such as an electronic switch 472 connected in parallel with the first capacitances $C_I$, and an electronic switch 474 connected in parallel with the first capacitances $C_I$, where the electronic switches 472 and 474 are closed as a function of a reset signal RST.

Moreover, the capacitances $C_I$ are charged via the currents provided by current sources 460 and 466 as a function of the signals O and Od.

For example, in various embodiments, the current source 460 provides a current $i_1$ and is connected via a first electronic switch 462 to a first input terminal of the differential integrator, such as the non-inverting/positive input terminal of the operation amplifier 476, wherein the electronic switch is closed 462 based on the signal O, i.e., the electronic switch 462 is closed when the signal O is asserted and opened when the signal O is de-asserted, thereby injecting a charge in the respective capacitance $C_I$ being proportional to $D_O \cdot i_1$.

Similarly, in various embodiments, the current source 466 provides a current $i_2$ and is connected via a second electronic switch 470 to a second input terminal of the differential integrator, such as the inverting/negative input terminal of the operation amplifier 476, wherein the electronic switch 470 is closed based on the signal Od, i.e., the electronic switch 470 is closed when the signal Od is asserted and opened when the signal Od is de-asserted, thereby injecting a charge in the respective capacitance $C_I$ being proportional to $D_{Od} \cdot i_2$. In various embodiments, the currents $i_1$ and $i_2$ have the same value. However, the values may also be different, whereby an additional factor would be introduced in the gain g shown in equation (24).

Accordingly, in various embodiments, a comparator 478 is configured to assert a signal CompS in response to determining that the voltage at the first capacitances $C_I$ is greater than the voltage at the second capacitances CI and de-assert the signal CompS in response to determining that the voltage at the first capacitances $C_I$ is smaller than the voltage at the second capacitances $C_I$. Thus, by gradually increasing (or decreasing) the current $I_{DAC}$, it is possible to determine the instant when the signal CompS changes logic level, which indicates that the current $I_{DAC}$ is near the optimal value $I_{DAC_{opt}}$.

Accordingly, in various embodiments, the driver circuit may set the current $I_{DAC}$ via the digital signal trial_current_cfg to a first value, whereby the signal CompS has a first logic value, e.g., is set to low. Next, the driver circuit may increase (or decrease) the current $I_{DAC}$ via the digital signal trial_current_cfg. Specifically, as mentioned before, in various embodiments, the circuit 42 and 44 are configured, such that the duty-cycle $D_{Od}$ decreases and the duty-cycle Do increases when increasing the current $I_{DAC}$. Accordingly, at a given value of the signal trial_current_cfg, the signal CompS changes its logic level, e.g., is set to high. Accordingly, the last value of the current $I_{DAC}$ before the signal CompS changes its logic level corresponds to a value of the current $I_{DAC,1}$, which is, e.g., (slightly) too small, and the first value of the current $I_{DAC,2}$ after the signal CompS changes its logic level corresponds to a value of the current $I_{DAC}$, which is, e.g., (slightly) too high. However, both values are near the optimal value $I_{DAC_{opt}}$ for the current $I_{DAC}$ and the driver circuit may select either the current $I_{DAC,1}$ (i.e., the respective value trial_current_cfg) or the current $I_{DAC,2}$ (i.e., the respective value trial_current_cfg).

FIG. 15 shows also two further optional electronic switches 464 and 468. Specifically, the current source 460 is connected via the electronic switch 464 to the second input terminal of the differential integrator, such as the inverting/negative input terminal of the operation amplifier 476, wherein the electronic switch is closed 464 based on the inverted version of the signal O, i.e., the electronic switch 464 is closed when the signal O is de-asserted and opened when the signal O is asserted, thereby injecting an additional charge in the respective capacitance $C_I$ being proportional to $(1-D_O) \cdot i_1$. Similarly, the current source 466 is connected via the electronic switch 468 to the first input terminal of the differential integrator, such as the non-inverting/positive input terminal of the operation amplifier 476, wherein the electronic switch is closed 468 based on the inverted version of the signal Od, i.e., the electronic switch 468 is closed when the signal Od is de-asserted and opened when the signal Od is asserted, thereby injecting an additional charge in the respective capacitance $C_I$ being proportional to $(1-D_{Od}) \cdot i_2$. Accordingly, in the embodiment considered, the optimal value $I_{DAC_{opt}}$ is reached when:

$$D_O \cdot i_1 + (1 - D_{Od}) \cdot i_2 = (1 - D_O) \cdot i_1 + D_{Od} \cdot i_2 \tag{29}$$

Specifically, when $i_1 = i_2$, equation (25) is satisfied when $D_o = D_{Od}$.

Figure 16:
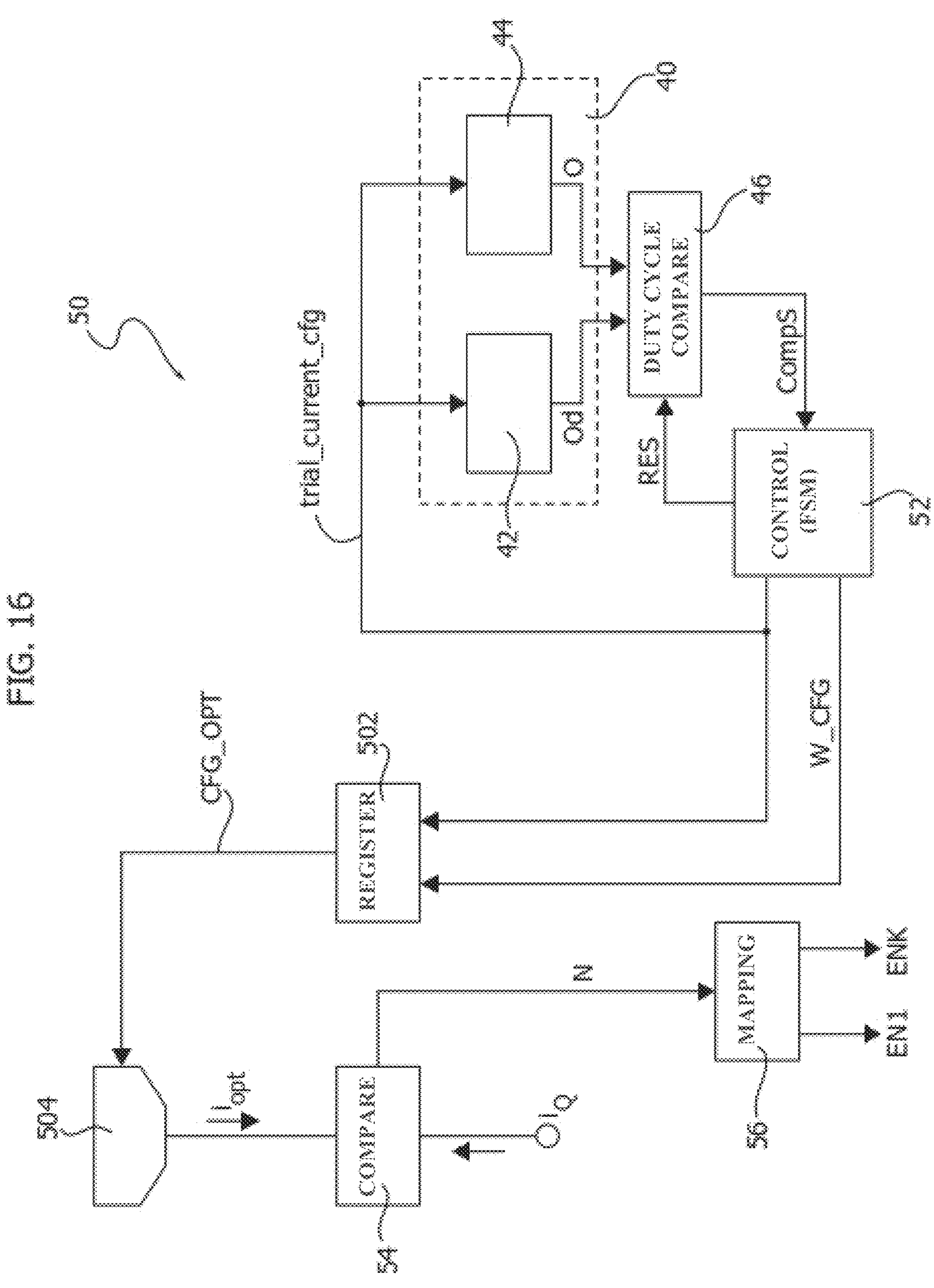
FIG. 16 shows an embodiment of a circuit configured to determine the partitioning value of a power stage.

FIG. 16 shows an embodiment of a circuit 50 configured to determine an optimal value $I_{DAC_{opt}}$ for the current $I_{DAC}$. Specifically, in line with the previous description, the circuit 50 comprises a circuit 42, a circuit 44 (or directly the combined circuit 40) and a duty-cycle comparison circuit 46. Specifically, the circuit 42 is configured to generate a PWM signal Od based on the signal trial_current_cfg and the circuit 44 is configured to generate a PWM signal O based on the signal trial_current_cfg. Moreover, a duty-cycle comparison circuit 46 is configured to set a comparison signal CompS to a first logic level, when the duty-cycle Do of the signal O is smaller than the duty-cycle $D_{Od}$ of the signal Od, and set the comparison signal CompS to a second logic level, when the duty-cycle Do of the signal O is greater than the duty-cycle $D_{Od}$ of the signal Od.

Accordingly, a control circuit 52 of the circuit 50, such as a finite-state machine (FSM), e.g., implemented with a sequential logic circuit and/or a microprocessor programmed via software, may sequentially increase (or decrease) the signal trial_current_cfg starting from an initial value and monitor the signal CompS. Specifically, in response to detecting a change of the logic level of the signal CompS, the control circuit 52 may store the current (or the previous) value of the signal trial_current_cfg to a register 502, which is schematically shown external to the circuit 52, but may also be integrated in the circuit 52. For example, in the embodiment considered, in response to detecting a change of the logic level of the signal CompS, the control circuit 52 stops increasing the signal trial_current_cfg and asserts a signal W_CFG, wherein the register 502 is configured to store the signal trial_current_cfg when the signal W_CFG is asserted.

In various embodiments, when using a differential integrator in the circuit 46, the control circuit 52 may also generate the reset signal RST. For example, the control circuit may generate a pulse in the reset signal RST when increasing the signal trial_current_cfg and the control circuit 52 may monitor the signal CompS after a given time period, such as a given number of clock cycles of a clock signal of the control circuit 52, such as 8, 16, 32 clock cycles.

Accordingly, in the embodiment considered, the register 502 provides the optimal value CFG_OPT of the signal trial_current_cfg for the current operating conditions of the reference FET of the power stage Q, wherein the signal trial_current_cfg is indicative of the current $I_{DAC_{opt}}$. In various embodiments, the control circuit 50 may repeat the above operations periodically in order to determine a new optimal value CFG_OPT.

Accordingly, similar to equation (11) and (15) and the respective description, the optimal value $I_{DAC_{opt}}$ may be used to determine the partitioning value N as a function of the RMS value $I_{Q,rms,ON}$, the peak value $I_{Q,max}$ or another value indicative of the current flowing through the power stage Q during the switch-on period $T_{ON}$, such as the average value $\bar{I}_{Q,ON}$ of the current $I_Q$. For example, as mentioned before, the driver circuit may assume a worst-case scenario and determine the optimal value $N_{opt}$ as:

$$N_{opt} = \frac{I_{Q,max}}{I_{rms,ON_{opt}}} \tag{30}$$

For example, as described in the foregoing, instead of using directly equation (30), the driver circuit may determine for each value of the partitioning value N respective threshold values for the RMS value $I_{Q,rms,ON}$, the peak value $I_{Q,max}$ or the average value $\bar{I}_{Q,ON}$. In this respect, when using the value $I_{DAC_{opt}}$ for determining the threshold values for the peak current $I_{Q,max}$ and in case of a ramp current signal, the gain g may also comprise the term $$\sqrt{3}$$

of equation (14).

Accordingly, in various embodiments, a circuit 54 is configured to generate a signal being indicative of the partitioning value N by comparing the value CFG_OPT with a value indicative of the current flowing through the power stage Q during the switch-on period $T_{ON}$. In general, the comparison may be performed in digital, e.g., by comparing the value CFG_OPT with a digital sample indicative of the current $I_Q$ flowing through the power stage Q, or in analog, e.g., by converting the signal CFG_OPT into a respective analog signal.

For example, in the embodiment considered, the signal CFG_OPT is provided to a further current DAC 504 configured to generate a current $i_{opt}$ as a function of the signal CFG_OPT, whereby the current $i_{opt}$ corresponds to (or at least is proportional to) the value $I_{DAC_{opt}}$. Accordingly, in the embodiment considered, the comparison circuit 54 is configured to generate a signal being indicative of the partitioning value N by comparing the current $i_{opt}$ with a signal $i_Q$ being indicative of the current $I_Q$. For example, as mentioned before, the signal $i_Q$ may indicate the RMS value $I_{Q,rms,ON}$, the peak value $I_{Q,max}$ or another value indicate of the current flowing through the power stage Q during the switch-on period $T_{ON}$, such as the average value $\bar{I}_{Q,ON}$ of the current $I_Q$.

In various embodiments, the comparison circuit 54 may select the partitioning value N by calculating the optimal partitioning value $N_{opt}$ in line with equation (11):

$$N_{opt} = \frac{i_Q}{i_{opt}} \tag{31}$$

and discretizing the value $N_{opt}$. Alternatively, the comparison circuit 54 may determine for each value of the partitioning value N a respective upper threshold and a respective lower threshold for the signal $i_Q$ as a function of the current $i_{opt}$, and determine the interval (between the respective upper threshold and the respective lower threshold) comprising the current $i_{opt}$, and select the respective partitioning value N.

As mentioned before, in general, for a given number K of electronic switches with respective partitioning factors, the circuit 54 may be configured to select the partitioning value N between a minimum partitioning value $N_{min}$ and a maximum partitioning value $N_{max}$, i.e., $N_{min} \leq N \leq N_{max}$. For example, when using K electronic switches with a partitioning factor of one, $N_{min}=1$ and $N_{max}=K$. Conversely, when using K electronic switches with a partitioning factor of $2^{(i-1)}$, $N_{min}=1$ and $N_{max}=(2^K-1)$. However, also other partitioning factors may be used.

Figure 17:
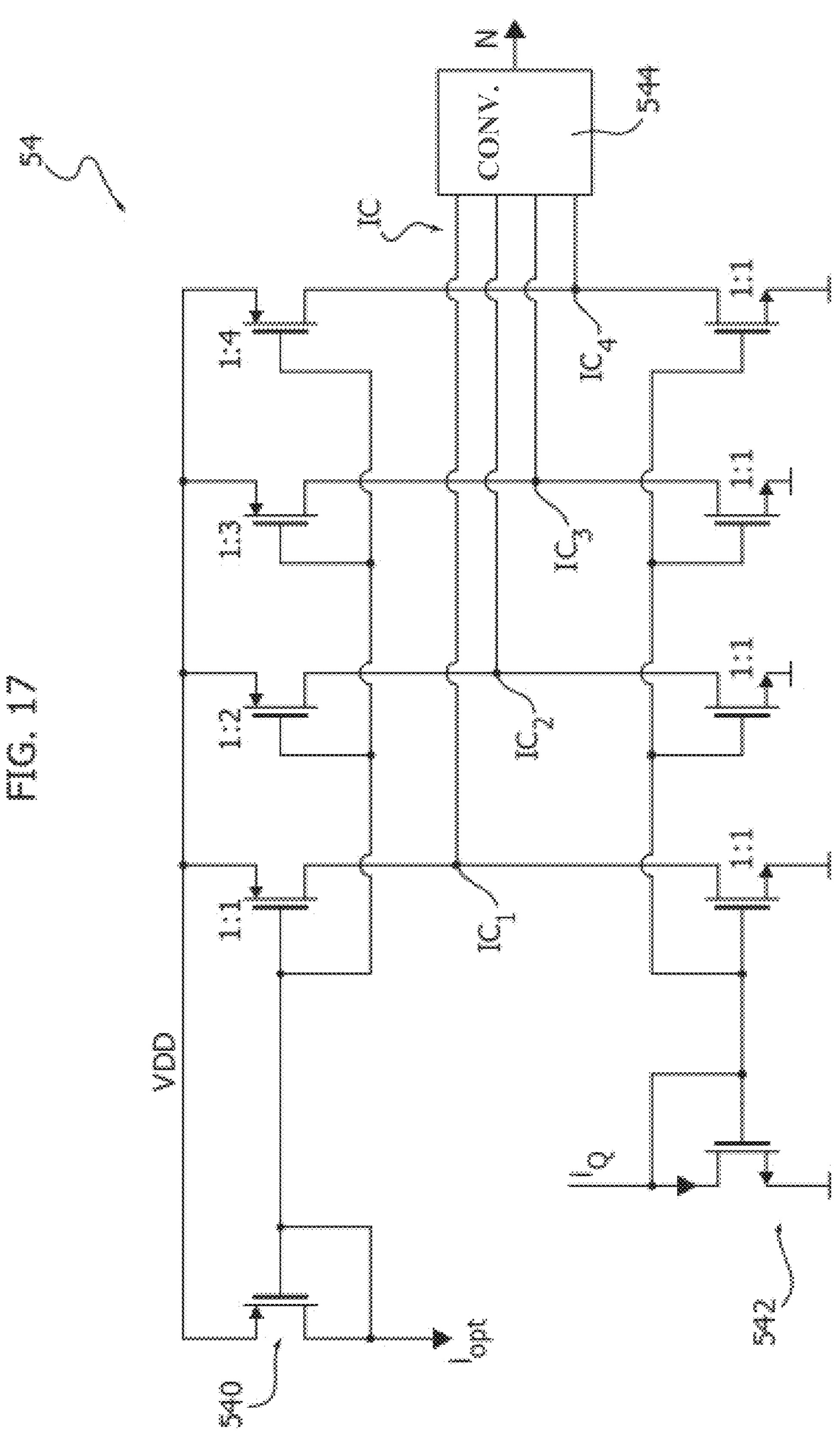
FIG. 17 shows a current comparison circuit of the circuit of FIG. 16.

For example, FIG. 17 shows an embodiment of an analog current comparator 54. Specifically, in the embodiment considered, the analog current comparator essentially operates as a current analog-to-digital converter (ADC) configured to receive a current to be measured and a reference current, and determine the signal corresponding to the ratio between the current to be measured and the reference current. According, in this case, the current $i_{opt}$ may be used as reference current, the current $i_Q$ may be used as current to be measured and the ADC 54 provides at output the partitioning value N.

For example, as mentioned before, in various embodiments, the circuit 54 is configured to select the partitioning value N between a minimum partitioning value $N_{min}=1$ and a maximum partitioning value $N_{max}$, i.e., $1 \leq N \leq N_{max}$. In this respect, the current comparator shown in FIG. 17 is configured to generate $(N_{max}-1)$ signals $IC_1$ to $IC_{(Nmax-1)}$, wherein a given signal $IC_j$, with $1 \leq j \leq (N_{max}-1)$ is set to: a first logic level, e.g., low, when the current $i_Q$ is greater than $j \cdot i_{opt}$; and a second logic level, e.g., high, when the current $i_Q$ is smaller than $j \cdot i_{opt}$.

For example, assuming a maximum partitioning value $N_{max}=5$, the circuit 54 may generate four signals $IC_1$, $IC_2$, $IC_3$ and $IC_4$ and: set all signals $IC_1$ to $IC_4$ to the second logic level when $i_Q < i_{opt}$; set the signal $IC_1$ to the first logic level when $i_Q > i_{opt}$; set the signal $IC_2$ to the first logic level when $i_Q>2\ i_{opt}$; set the signal $IC_3$ to the first logic level when $i_Q>3\ i_{opt}$; and set the signal $IC_4$ to the first logic level when $i_Q>4\ i_{opt}$.

Accordingly, a conversion (CONV.) circuit 544 of the circuit 54 may be used to determine the partitioning value N as a function of the signals IC. For example, the conversion circuit 544 may determine the most significant bit $IC_m$ of the signals IC being set to the first logic level (e.g., low) and determine the partitioning value N as (m+1). For example, again assuming that four signals $IC_1$, $IC_2$, $IC_3$ and $IC_4$ are used, the circuit 54 may generate the following signal $IC_1$, $IC_2$, $IC_3$ and $IC_4$ as a function of the current $i_Q$, and the conversion circuit 544 may map the signals $IC_1$, $IC_2$, $IC_3$ and $IC_4$ to the respective partitioning value N:

| $i_Q$ | $IC_1$ | $IC_2$ | $IC_3$ | $IC_4$ | N |
|---|---|---|---|---|---|
| $i_Q < i_{opt}$ | 1 | 1 | 1 | 1 | 1 |
| $i_{opt} < i_Q < 2\ i_{opt}$ | 0 | 1 | 1 | 1 | 2 |
| $2\ i_{opt} < i_Q < 3\ i_{opt}$ | 0 | 0 | 1 | 1 | 3 |
| $3\ i_{opt} < i_Q < 4\ i_{opt}$ | 0 | 0 | 0 | 1 | 4 |
| $4\ i_{opt} < i_Q$ | 0 | 0 | 0 | 0 | 5 |

For example, in order to generate the signals $IC_1$ to $IC_{(Nmax-1)}$, the conversion circuit 54 comprises a current mirror 540 comprising a plurality of $(N_{max}-1)$ output stages. Specifically, the input stage of the current mirror 540 receives the current $i_{opt}$, and each output stage of the current mirror 540 has a different mirror factor. Specifically, the first output stage has a mirroring factor of 1:1 and provides a current $i_{opt}$, the second output stage has a mirroring factor of 1:2 and provides a current $2\cdot I_{opt}$, the third output stage has a mirroring factor of 1:3 and provides a current $3\cdot I_{opt}$, etc. Specifically, in various embodiments, the j-th output stage of the current mirror 540 has a mirroring factor of 1:j and provides a current $j\cdot i_{opt}$, with j being an integer and $1\leq j\leq(N_{max}-1)$.

Similarly, in the embodiment considered, the current $i_Q$, such as the peak current $I_{Q,max}$, is provided to a current mirror 542 comprising a plurality of $(N_{max}-1)$ output stages. Specifically, the input stage of the current mirror 540 receives the current $i_Q$, and each output stage of the current mirror 542 has a mirror factor of 1:1.

In the embodiment considered, each output stage of the current mirror 540 is connected in series with a respective output stage of the current mirror 542. For example, in the embodiment considered, the current mirror 540 is implemented with p-channel FETs having their source terminals connected to a supply voltage VDD, the current mirror 542 is implemented with n-channel FETs having their source terminals connected to a ground, and the drain terminal of each FET of the current mirror 540 is connected to the drain terminal of a respective FET of the current mirror 542. Accordingly, in case a given output stage/FET of the current mirror 542 sinks a current being greater than the current sourced by the respective output stage/FET of the current mirror 540, the drain terminal of the FETs is pulled to ground, i.e., the voltage at the intermediate node of the j-th output stage is set to low when:

$$i_Q > j\cdot i_{opt} \quad (32)$$

Accordingly, as shown in FIG. 16, a mapping circuit 56 may be configured to generate for each electronic switch S1-SK a respective enable signal EN1-ENK as a function of the partitioning value N, wherein each enable signal EN indicates whether the respective switch should be driven/enabled (e.g., EN=1) or not driven/disabled (e.g., EN=0). For example, as mentioned before, the mapping circuit 56 may be configured to select/enable a sub-set of the electronic switch S1-SK in order to obtain the requested partitioning value N.

In general, the operation of the conversion circuit 544 may also be included in the mapping circuit 56 (and the conversion circuit 544 may be omitted), i.e., the mapping circuit 56 may be configured to generate the enable signals EN1-ENK (directly) as a function of the signals provided by the conversion circuit 54.

Figure 18:
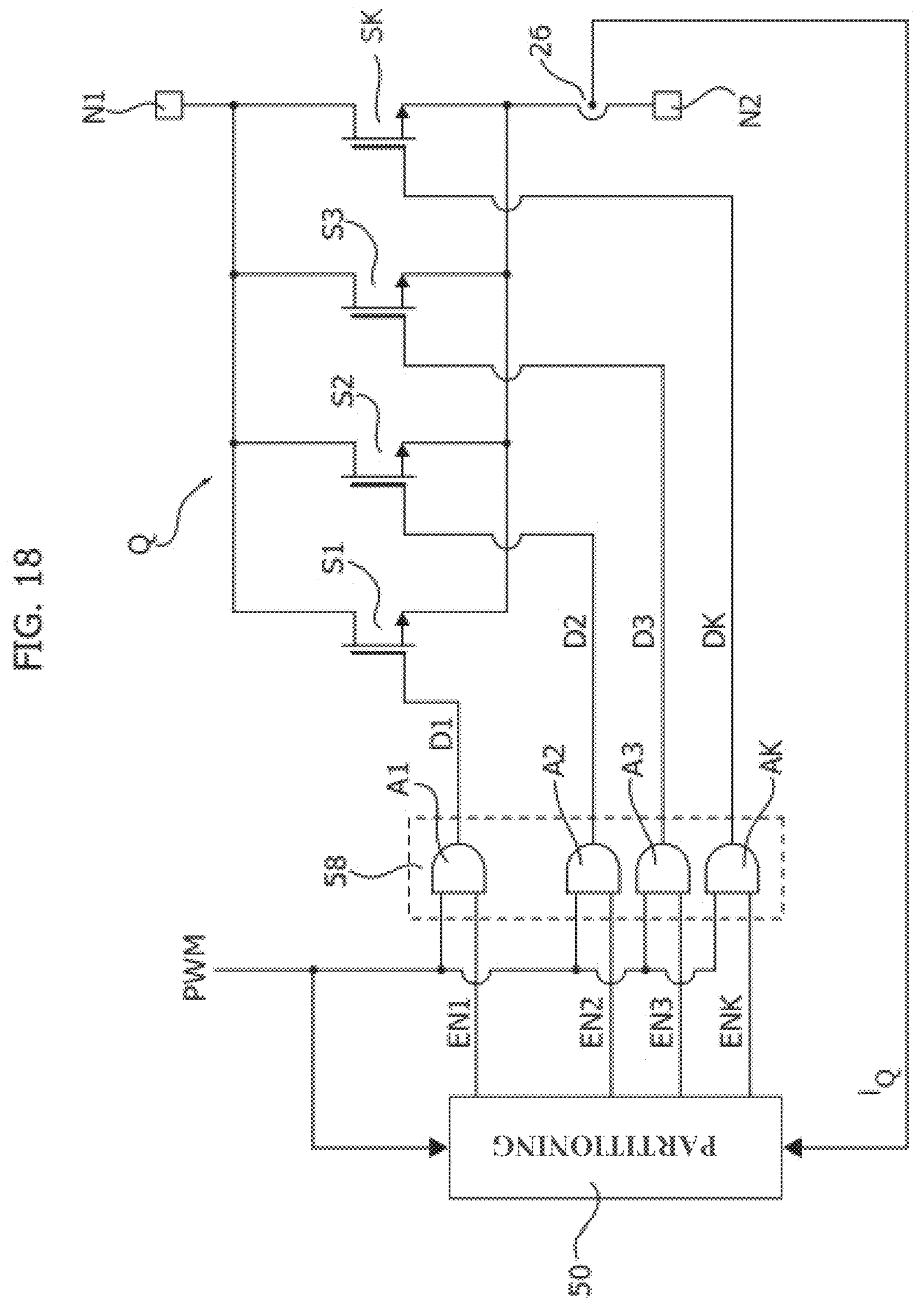
FIG. 18 shows an example of a driver circuit of a power stage with switch partitioning.

FIG. 18 shows an embodiment a complete driver circuit of a power stage Q. In various embodiments, the driver circuit is integrated with the power stage Q in the same integrated circuit. Specifically, in the embodiment considered, the power stage Q comprises again a given number of K (physical and/or virtual) FETs S1-SK, such as MOSFETs, e.g., n-channel FETs. The drain terminal of each FET S1-SK is connected to a first node N1 and the source terminal of each FET S1-SK is connected to a second node N2. Accordingly, the path between the nodes N1 and N2 corresponds to the current path of each FET S1-SK, and thus the power stage Q. Moreover, the gate terminal of each FET S1-SK receives a respective drive signal D1-DK.

As described in the foregoing, the circuit 50 is configured to generate for each FET S1-SK of the power stage Q a respective enable signal EN1-ENK as a function of a signal $i_Q$ indicative of the (total) current $I_Q$ flowing through the power stage Q and a signal PWM having switch-on periods $T_{ON}$ and switch-of periods $T_{OFF}$. In general, any suitable PWM generator circuit may be used to generate the signal PWM.

In the embodiment considered, the signal $i_Q$ is provided by a current sensor 26 configured to monitor the current $I_Q$. For example, the sensor 26 may comprise a shunt resistor connected between the source terminals of the FETs S1-SK and the node N2 or between the drain terminals of the FETs S1-SK and the node N1. In general, it is sufficient that the current sensor 26 is configured to monitor the current $I_Q$ during the switch-on periods $T_{ON}$ of the signal PWM. For example, as shown in FIG. 6, the current sensor 26 may also be placed in other locations, e.g., the current sensor 26*a* may provide the signal $i_Q$. Moreover, instead of using a shunt resistor, also other current sensors may be used. For example, in this context may be cited United States Patent Application Publication No. 2022/0173657 A1, whose content is incorporated herein by reference for this purpose. As mentioned before, the signal $i_Q$ may indicate the RMS value $I_{Q,rms,ON}$, the peak value $I_{Q,max}$ or another value indicate of the current flowing through the power stage Q during the switch-on period $T_{ON}$, such as the average value $I_{Q,ON}$ of the current $I_Q$. Accordingly, the current sensor 26 may already provide the respective value, or the current sensor 26 may provide the instantaneous value of the current $I_Q$ and the circuit 50 may determine the respective value for the signal $i_Q$.

In the embodiment considered, the enable signals EN1-ENK and the signal PWM are provided to a FET driver circuit 58. Specifically, the FET driver circuit 58 is configured to generate for each FET S1-SK the respective drive signal D1-DK by combining the signal PWM with the respective enable signal EN1-ENK. Specifically, the FET driver circuit 58 is configured to:

set the respective drive signal D1-DK to a first logic level indicating that the respective FET should be closed, when the signal PWM is asserted (indicates that the current path of the power stage Q should be closed) and the respective enable signal EN1-EK is asserted; and set the respective drive signal D1-DK to a second logic level indicating that the respective FET should be opened, when the signal PWM is de-asserted (indicates that the current path of the power stage Q should be opened) or the respective enable signal EN1-EK is de-asserted.

For example, for this purpose, the FET driver circuit 58 may comprise for each FET a respective combinational logic circuit A1-AK configured to implement the above operation. For example, in case the current path of the power stage Q should be closed when the signal PMW is set to high and a given FET should be enabled when the respective enable signal EN1-ENK is set to high, each combinational logic circuit A1-AK may be implemented with an AND gate.

In various embodiments, the FET driver circuit 58 may also implement other functions in order to generate the drive signals D1-DK, such as a slew-rate control and/or a level shifting. In various embodiments, the circuits 50 and 58 may be implemented together with the power stage Q and optionally the current sensor 26 in the same integrated circuit.

The circuit shown in FIG. 18 may thus be used for each power stage Q of a more complex circuit, such as an electronic converter. For example, as described in the foregoing (see, e.g., the description of FIGS. 3 to 6), an electronic converter comprises often two electronic switches, which may be arranged as a half-bridge. In general, the circuit may also comprise a plurality of half-bridges, e.g., in order to form a full-bridge and/or for implementing a plurality of phases of an electronic converter or a motor driver.

Figure 19:
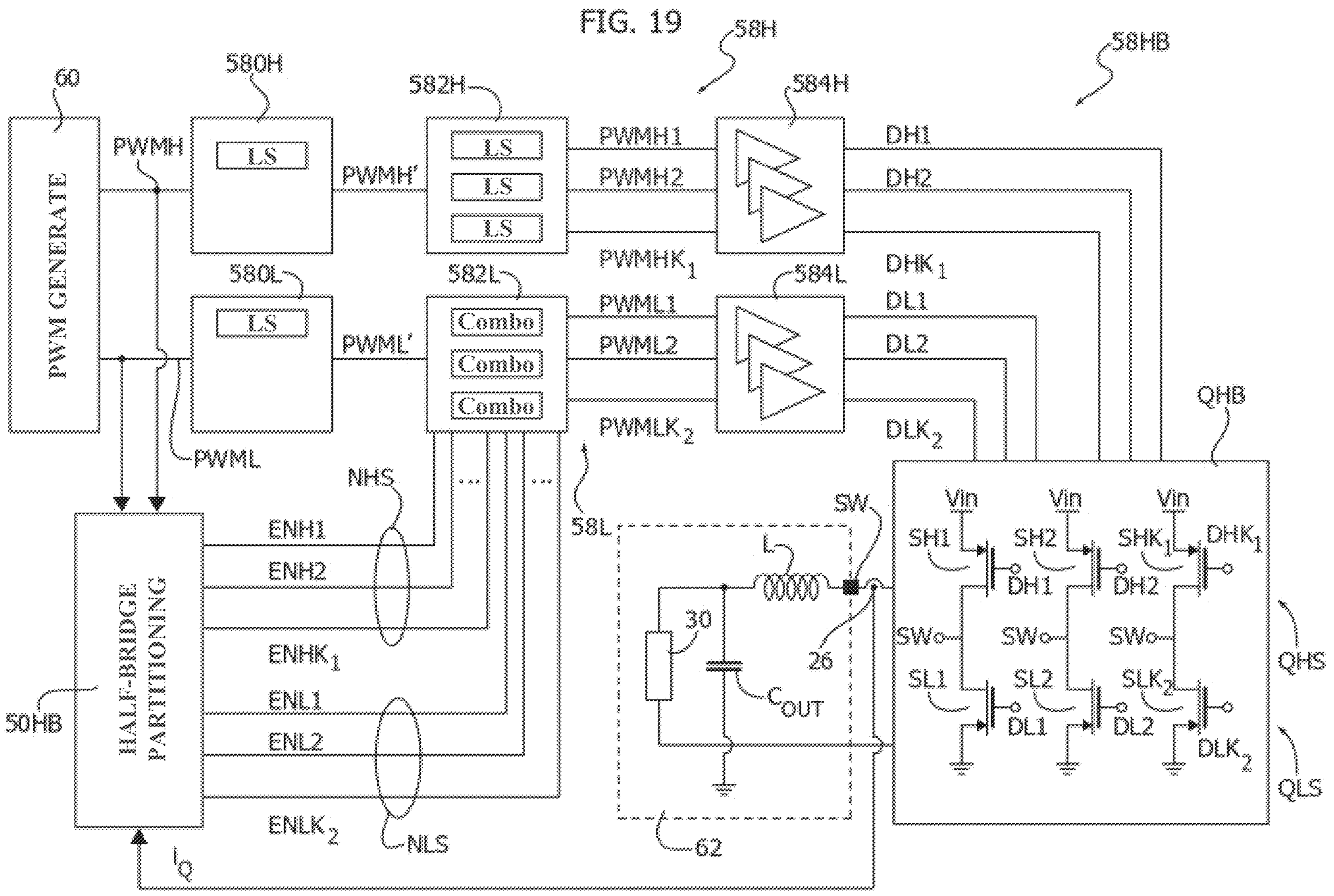
FIG. 19 shows a half-bridge driver circuit for a half-bridge power stage with switch partitioning.

For example, FIG. 19 shows an embodiment of a half-bridge driver circuit according to the present disclosure. Specifically, in the embodiment considered, the half-bridge is implemented with a half-bridge power stage QHB, comprising a high-side power stage QHS and a low-side power stage QLS. For example, the high-side power stage QHS may replace the high-side switch Q1 and the low-side power stage QLS may replace the low-side switch Q2 of FIG. 6. Accordingly, the high side power stage QHS comprises $K_1$ FETs SH1-SH$K_1$, such as n-channel MOSFETS, and the low side power stage QLS comprises $K_2$ FETs SL1-SL$K_2$, such as n-channel MOSFETS. In various embodiments, the power stages comprise the same number of FETs, i.e., $K_1=K_2$. In case of a half-bridge implemented with n-channel FETs, the node N1 of the high-side power stage QHS (drain nodes of the FETs SH1-SH$K_1$) is connected to a first voltage, such as a supply voltage $V_{in}$, the node N2 of the high-side power stage QHS (source nodes of the FETs SH1-SH$K_1$) is connected to a switching node SW, which in turn is connected to the node N1 of the low-side power stage QLS (drain nodes of the FETs SL1-SL$K_2$), and the node N2 of the low-side power stage QLS (source nodes of the FETs SL1-SL$K_2$) is connected to a second voltage, such as a ground.

For example, the switching node SW may be connected to a load 62, which, e.g., may comprise the reactive components of an electronic converter, such as L and/or Cout, and/or other loads 30 (see the description of FIGS. 1 to 8), one or more motor windings, etc.

In the embodiment considered, the gate terminal of each FET SH1-SH$K_1$ implementing the high-side power stage QHS is thus connected to a respective drive signal DH1-DH$K_1$, such as signals DH1, DH2 and DH3, and the gate terminal of each FET SL1-SL$K_2$ implementing the low-side power stage QLS is connected to a respective drive signal DL1-DL$K_2$, such as signals DL1, DL2 and DL3.

As described in the foregoing, in various embodiments, each power stage Q is driven based on a respective PWM signal, i.e., a signal PWMH for the high-side power stage QHS and a signal PWML for the low-side power stage QLS. For example, the signal PWMH and PWML may be generated via a circuit 60, such as a control circuit 22 of an electronic converter (see also the description of FIGS. 3-8).

Accordingly, in various embodiments, the half-bridge driver circuit may comprise for each power stage QHS and QLS respective circuits 50 and 58. Conversely, FIG. 19 shows an embodiment, wherein the half-bridge driver circuit comprises a combined partitioning circuit 50HB configured to generate a signals indicative of the partitioning value NHS for the high-side power stage QHS and signals indicative of the partitioning value NLS for the low-side power stage QLS. For example, as described in the foregoing, this signal may correspond to enable signals ENH1-ENH$K_1$ for each FET of the high-side power stage QHS and enable signals ENL1-ENL$K_2$ for each FET of the low-side power stage QLS. As described in the foregoing, the enable signals may be generated based on the partitioning factors of the FETs of a given power stage Q.

Accordingly, in the embodiment considered, the half-bridge partitioning circuit 50HB is configured to generate the signals indicative of the partitioning value NHS, e.g., the signals ENH1-ENH$K_1$, as a function of the signal PWMH and a signal indicative for the (total) current $I_{QHS}$ flowing through the high-side power stage QHS, and the signals indicative of the partitioning value NLS, e.g., the signals ENL1-ENL$K_2$, as a function of the signal PWML and a signal indicative for the (total) current $I_{QLS}$ flowing through the low-side power stage QLS. For example, in FIG. 19, the half-bridge partitioning circuit 50HB receives a single signal $i_Q$ indicative of the current provided via the switching node SW, which indicates the current $I_{QHS}$ when the signal PWMH is asserted and the current $I_{QLS}$ when the signal PWML is asserted. However, also two separate current sensors may be used. For example, the use of a single current sensor is particularly useful, when the current provided via the node SW has a triangular shape (as in many electronic converters), because in this case the current sensor 26 may provide a value indicative of the peak value of the current, which is the same for the high side power stage QHS and the low side power stage QLS, i.e., the peak value $I_{QHS,max}=I_{QLS,max}=I_{Q,max}$.

Accordingly, in the embodiment considered, the half-bridge driver circuit comprises a FET driver circuit 58H for the power stage QHS and a FET driver circuit 58L for the power stage QLS.

Specifically, the driver circuit described in the foregoing may be used to drive the low-side power stage QLS, wherein one of the low-side FETs SL1-SL$K_2$ represents the reference FET, and the driver circuit receives the low-side PWM signal PWML. Accordingly, the FET driver circuit 58 of the driver circuit, now identified as driver circuit 58L, is configured to generate for each low-side FETs SL1-SL$K_2$ a respective drive signal DL1-DL$K_2$ by combining a respective low-side enable signal ENL1-ENL$K_2$ with the low-side PWM signal PWML. Similarly, an additional FET driver circuit 58H is configured to generate for each high-side FETs SH1-SH$K_1$ a respective drive signal DH1-DH$K_1$ by combining a respective high-side enable signal ENH1-ENH$K_1$ with the high-side PWM signal PWMH.

For example, in the embodiment considered, the high-side FET driver circuit 58H comprises for each high-side FET SH1-SHK$_1$, a respective high-side driver 584H configured to generate a respective drive signal DH1-DHK$_1$ as a function of a respective signal PWMH1-PWMHK$_1$. For example, the high-side driver 584H may be supplied with a higher supply voltage or preferably via a floating voltage $V_{BOOT}$, e.g., obtained via a conventional bootstrap circuit. For example, in various embodiments, the supply voltage $V_{BOOT}$ is floating with respect to the voltage $V_{SW}$ at the node SW and the voltage difference ($V_{BOOT}-V_{SW}$) has the same amplitude as the voltage $V_{in}$ being referred to ground.

Accordingly, in the embodiment considered, a circuit 582H may be configured to generate the signals PWMH1-PWMHK$_1$ as a function of the signal PWMH and the signal indicative for the partitioning value NHS, e.g., the enable signals ENH1-ENHK$_1$. For example, when using enable signals ENH1-ENHK$_1$, the circuit 582H may comprise for each enable signal ENH1-ENHK$_1$ a respective combinational logic circuit (e.g., a logic gate, such as an AND gate) configured to generate a respective signal PWMH1-PWMHK$_1$ by combining the signal PWMH with a respective enable signal ENH1-ENHK$_1$ (see, e.g., the description of the circuits A1-AK of FIG. 18).

Accordingly, the circuit 582H may comprise one or more level shifters (LS) for shifting the level of the enable signals ENH1-ENHK$_1$, or one or more level shifters for shifting the level of the signals PWMH1-PWMHK$_1$. Moreover, FIG. 19 shows schematically a circuit 580H configured generate a signal PWMH' by adapting the voltage level of the signal PWMH to the level of the circuit 580H, e.g., by implementing a level shifting, wherein the circuit 580H uses the signal PWMH'.

Similarly, in the embodiment considered, the low-side FET driver circuit 58L comprises for each low-side FET SL1-SLK$_2$, a respective low-side driver 584L configured to generate a respective drive signal DL1-DLK$_2$ as a function of a respective signal PWML1-PWMLK$_2$. For example, the low-side driver 584L may be supplied with the voltage $V_{in}$.

Accordingly, in the embodiment considered, a circuit 582L may be configured to generate the signals PWML1-PWMLK$_2$ as a function of the signal PWML and the signal indicative for the partitioning value NLS, e.g., the enable signals ENL1-ENLK$_2$. For example, when using enable signals ENL1-ENLK$_2$, the circuit 582L may comprise for each enable signal ENL1-ENLK$_2$ a respective combinational (Combo) logic circuit (e.g., a logic gate, such as an AND gate) configured to generate a respective signal PWML1-PWMLK$_2$ by combining the signal PWML with a respective enable signal ENL1-ENLK$_2$ (see, e.g., the description of the circuits A1-AK of FIG. 18).

Usually, the circuit 582L does not comprise one or more level shifters for shifting the level of the enable signals ENL1-ENLK$_2$, or one or more level shifters for shifting the level of the signals PWML1-PWMLK$_2$. However, in various embodiments, the circuit 582L may have associated a circuit 580L configured to generate a signal PWML' by adapting the voltage level of the signal PWML to the level of the circuit 580L, wherein the circuit 580L uses the signal PWML'.

Accordingly, in various embodiments, the partitioning circuit 50 described in the foregoing is modified in order to generate not only the enable signals ENL1-ENLK$_2$, but also the additional enable signals ENH1-ENHK$_1$.

Figure 20:
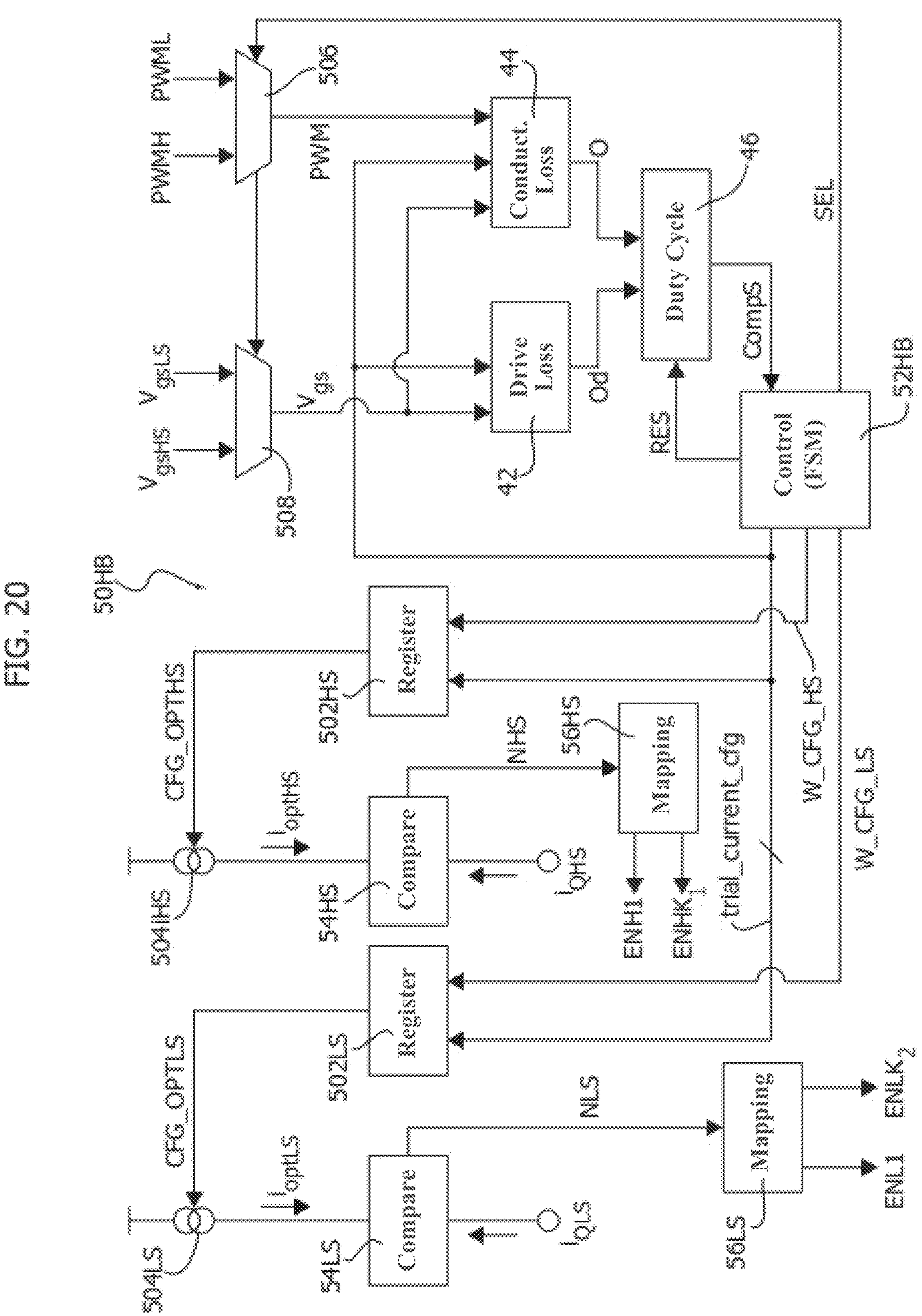
FIG. 20 shows an embodiment of a circuit configured to determine the partitioning value of a high-side power stage and a low-side power stage in the circuit of FIG. 19.

FIG. 20 shows an embodiment of the half-bridge partitioning circuit 50HB. Specifically, compared to FIG. 16, the half-bridge partitioning circuit 50HB comprises a single circuit 42 for estimating the driving losses and a single circuit 44 for estimating the conduction losses (or a single combined circuit 40).

Specifically, when using FETs of the same technology, the high-side reference FET and the low-side reference FET have the same driving losses and switch-on resistance $R_{ds,on}$ when the power stage QHS and QLS use the same gate-source voltage. Accordingly, in various embodiments, the circuit 60HB may comprise a multiplexer 508 configured to provide either the gate-source voltage $V_{gsHS}$ of the high-side power stage QHS or the gate-source voltage $V_{gsLS}$ of the high-side power stage QLS as voltage $V_{gs}$ to the circuits 42 and 44 as a function of the selection signal SEL. However, as mentioned before, when using a bootstrap architecture, the amplitude of the gate-source voltages $V_{gsHS}$ and $V_{gsLS}$ may also be the same, and may correspond, e.g., to the voltage $V_{in}$. Accordingly, the multiplexer 508 may also be omitted.

Moreover, in order to determine the conduction losses, the circuit 44 should take into account the actual duty-cycle of the PWM signal used to drive the power stage Q, i.e., the signal PWMH for the power stage QHS and the signal PWML for the power stage PWML. Accordingly, in various embodiments, the signal PWM used by the circuit 44 is provided by a multiplexer 506 configured to provide either the signal PWMH or the signal PWML as a function of the selection signal SEL.

Accordingly, in this way, a control circuit 52HB (essentially implementing the function of the control circuit 52) of the circuit 50HB, such as a finite-state machine, e.g., implemented with a sequential logic circuit and/or a microprocessor programmed via software, may set the selection signal SEL, in order to select during a high-side mode (first mode) the signal PWMH as signal PWM for the circuit 44, and optionally the gate-source voltage $V_{gsHs}$. Next, the circuit 52HB may sequentially increase (or decrease) the signal trial_current_cfg starting from an initial value and monitor the signal CompS. Specifically, in response to detecting a change of the logic level of the signal CompS, the control circuit 52HB may store the current (or the previous) value of the signal trial_current_cfg to a register 502HS. For example, in the embodiment considered, in response to detecting a change of the logic level of the signal CompS, the control circuit 52HB stops increasing the signal trial_current_cfg and asserts a signal W_CFGHS, wherein the register 502HS is configured to store the signal trial_current_cfg when the signal W_CFGHS is asserted.

Accordingly, in various embodiments, the control circuit may then set the selection signal SEL, in order to select during a low-side mode (second mode) the signal PWML as signal PWM for the circuit 44, and optionally the gate-source voltage $V_{gsLS}$. Next, the circuit 52HB may sequentially increase (or decrease) the signal trial_current_cfg starting from an initial value and monitor the signal CompS. Specifically, in response to detecting a change of the logic level of the signal CompS, the control circuit 52HB may store the current (or the previous) value of the signal trial_current_cfg to a register 502LS. For example, in the embodiment considered, in response to detecting a change of the logic level of the signal CompS, the control circuit 52HB stops increasing the signal trial_current_cfg and asserts a signal W_CFGLS, wherein the register 502LS is configured to store the signal trial_current_cfg when the signal W_CFGLS is asserted.

As indicated in the foregoing, the control circuit 52HB may also generate the reset signal RST.

Accordingly, in the embodiment considered, the register 502HS provides the optimal value CFG_OPTHS of the signal trial_current_cfg for the current operating conditions of the FETs of the power stage QHS and the register 502LS provides the optimal value CFG_OPTLS of the signal trial_current_cfg for the current operating conditions of the FETs of the power stage QLS. Accordingly, similar to the previous description, a circuit 54HS may generate the partitioning value NHS or directly the respective enable signals ENH1-$ENHK_1$ (as schematically shown via a mapping circuit 56HS) by comparing the signal CFG_OPTHS (or the respective current $i_{optHS}$ generated by a DAC 540HS) with the current $i_{QHS}$, such as the current $I_{Q,max}$. Similarly, a circuit 54LS may generate the partitioning value NLS or directly the respective enable signals ENL1-$ENLK_2$ (as schematically shown via a mapping circuit 56LS) by comparing the signal CFG_OPTLS (or the respective current $i_{optLS}$ generated by a DAC 540LS) with the current $i_{QLS}$, such as the current $I_{Q,max}$.

Accordingly, in the embodiment considered, the circuit 50HS uses the same circuits 42 and 44 (or similarly a single circuit 40) in order to determine the optimal values CFG_OPTHS and CFG_OPTLS during two operation modes. Specifically, for this purpose, the circuits 44 and 506 are configured to, in the low-side mode, apply the scaled reference current $I_{DAC}$ to the capacitance C when the low-side PWM signal PWML is asserted and, in the high-side mode, apply the scaled reference current $I_{DAC}$ to the capacitance C when the high-side PWM signal PWMH is asserted. Moreover, the control circuit 52HB is configured to, in the low-side mode, set the reference current $I_{DAC}$ to an initial value and then either increase or decrease the reference current $I_{DAC}$ until the logic level of the comparison signal CompS changes, and store a low-side value CFG_OPTLS indicative of the value $i_{opt}$ of the reference current $I_{DAC}$ when the logic level of the comparison signal CompS changes. Similarly, in the high-side mode, the control circuit 52HB sets the reference current $I_{DAC}$ to an initial value and then either increases or decreases the reference current $I_{DAC}$ until the logic level of the comparison signal CompS changes, and stores a high-side value CFG_OPTHS indicative of the value $i_{opt}$ of the reference current $I_{DAC}$ when the logic level of the comparison signal CompS changes. Moreover, while the comparison circuit 54, 56, 504 may be used to generate the low-side enable signals ENL1-$ENLK_2$ by comparing the low-side value CFG_OPTLS with the signal $i_Q$ indicative of the current provided by the switching node SW, an additional comparison circuit 54HS, 56HS, 504HS is used for the high side enable signals. Specifically, the further comparison circuit 54HS, 56HS, 504HS is configured to determine for each high-side FET SH1-$SHK_1$ a respective high-side enable signal ENH1-$ENHK_1$ by comparing the high-side value CFG_OPTHS with the signal $i_Q$ indicative of the current provided by the switching node SW.

Figure 21:
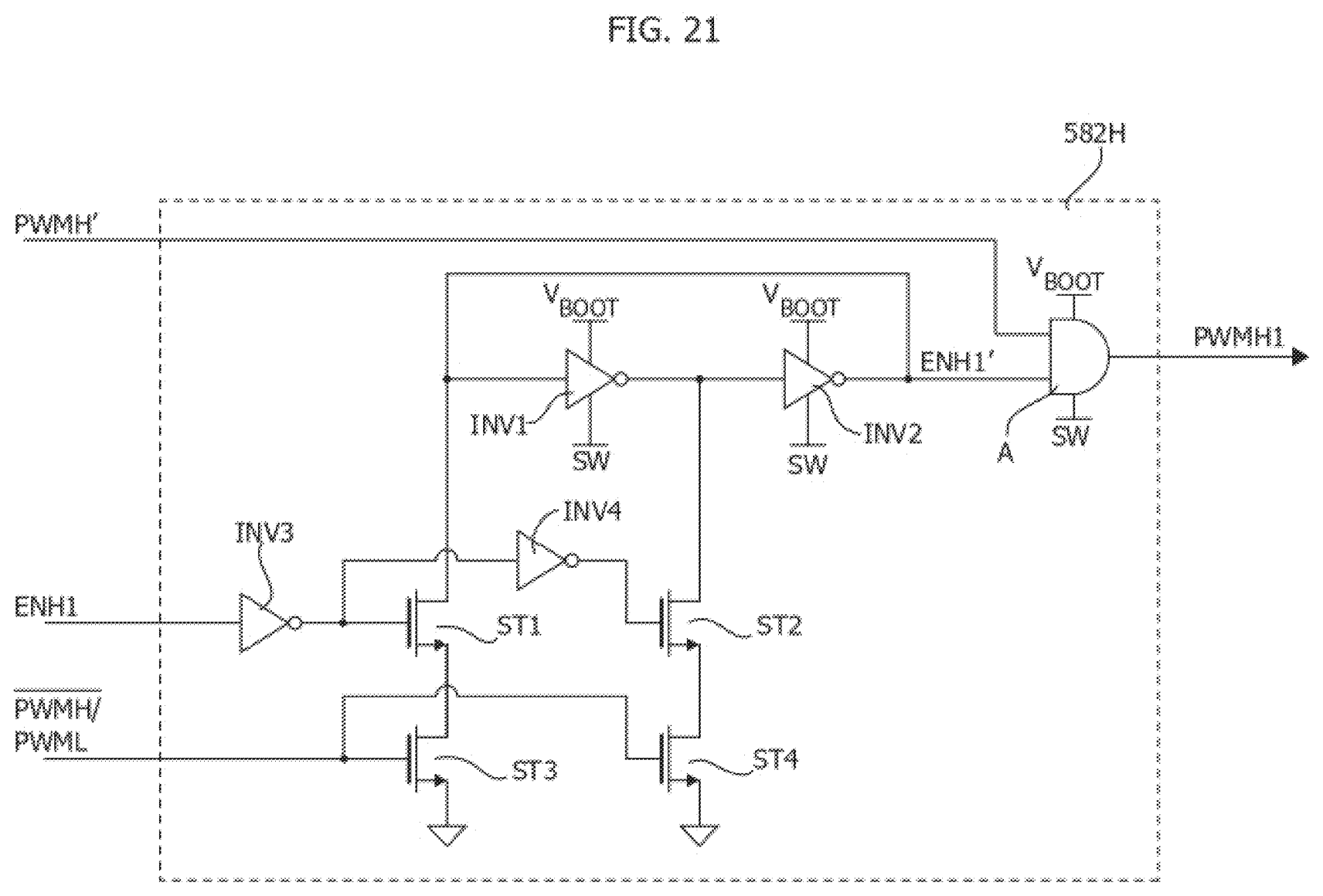

FIG. 21 shows a first embodiment of the circuit 582H configured to generate-a generic high side signal, such as the PWMH1, as a function of the respective enable signal, such as ENH1, and the (level-shifted) signal PWMH'. In general, the same circuit may also be used within the power stage driver circuit 58 in case a level shifter is required.

In the embodiment considered, the circuit 582H comprises a data storage element. Specifically, in the embodiment considered, the storage element is implemented with two inverters (logic NOT gates) INV1 and INV2 connected to form a ring. However, also any multiple of two inverter stages may be used. Accordingly, the input of each inverter stage is connected to the output of an upstream/previous inverter stage, and the input of the first inverter stage is connected to the output of the last inverter stage. Specifically, in the embodiments considered, the storage element is supplied via the floating voltage $V_{BOOT}$, e.g., the inverter stages are connected between the voltages $V_{BOOT}$ and $V_{SW}$.

Specifically, when the input of the first (or an odd) inverter stage is set to low, the output of the respective inverter stage is set to high, whereby the output of the last inverter stage is set to low. Conversely, when the input of the second (or an even) inverter stage is set to low, the output of the respective inverter stage is set to high, whereby the output of the last inverter stage is set to high. In the embodiment considered, the circuit 580H comprises thus also a first subcircuit configured to selectively set the input of the first (or an odd) inverter stage to low and a second subcircuit configured to selectively set the input of the second (or an even) inverter stage to low.

For example, in the embodiment considered, the first subcircuit represents a reset circuit of the signal ENH1' and is configured to set the input of the first (or an odd) inverter stage to low in response to determining that the enable signal ENH1 indicates that the FET associated with the signal PWMH is disabled, e.g., when the signal ENH1 is set to low. For example, in the embodiment considered, the input of the first (or an odd) inverter stage is connected via an electronic switch ST1, such as an n-channel FET, to ground, wherein the control terminal (e.g., the gate terminal) of the electronic switch ST1 is driven via the inverted version of the enable signal ENH1, as schematically shown via an inverter INV3.

Conversely, the second subcircuit represents a set circuit of the signal ENH1' and is configured to set the input of the second (or an even) inverter stage to low in response to determining that the enable signal ENH1 indicates that the FET associated with the signal PWMH is enabled, e.g., when the signal ENH1 is set to high. For example, in the embodiment considered, the input of the second (or an even) inverter stage is connected via an electronic switch ST2, such as an n-channel FET, to ground, wherein the control terminal (e.g., the gate terminal) of the electronic switch ST2 is driven via the enable signal ENH1, as schematically shown via an optional further inverter INV4.

Accordingly, in this case, the output of the last inverter stage (e.g., the inverter stage INV2) corresponds to a level-shifted version ENH1' of the enable signal ENH1, i.e., the signal ENH1' is set to the voltage $V_{BOOT}$ (high) or $V_{SW}$ (low) at the switching node SW. Accordingly, in the embodiment considered, a logic gate A, such as an AND gate may be used to generate the signal PWMH by combining the level-shifted signal PWMH' with the level-shifted signal ENHF'. Also, the combinational logic circuit A is supplied by the floating voltage $V_{BOOT}$.

In various embodiments, in order to ensure that the signal ENH1' is only updated when the signal PWMH' is de-asserted (e.g., is low), the first subcircuit may be configured to set the input of the first (or an odd) inverter stage to low in response to determining that the enable signal ENH1 indicates that the FET associated with the signal PWMH is disabled, e.g., when the signal ENH1 is set to low, and the (not level-shifted) signal PWMH is de-asserted (e.g., is low). For example, in the embodiment considered, the input of the first (or an odd) inverter stage is connected via a series connection of two electronic switches ST1 and ST3, such as an n-channel FETs, to ground, wherein the control terminal (e.g., the gate terminal) of the electronic switch ST1 is driven via the inverted version of the enable signal ENH1 and the control terminal (e.g., the gate terminal) of the electronic switch ST3 is driven via the inverted version of the signal PWMH.

Conversely, the second subcircuit may be configured to set the input of the second (or an even) inverter stage to low in response to determining that the enable signal ENH1 indicates that the FET associated with the signal PWMH is enabled, e.g., when the signal ENH1 is set to high, and the (not level-shifted) signal PWMH is de-asserted (e.g., is low). For example, in the embodiment considered, the input of the second (or an even) inverter stage is connected via a series connection of two electronic switches ST2 and ST4, such as an n-channel FETs, to ground, wherein the control terminal (e.g., the gate terminal) of the electronic switch ST2 is driven via the enable signal ENH1 and the control terminal (e.g., the gate terminal) of the electronic switch ST4 is driven via the inverted version of the signal PWMH.

In various embodiments, instead of using the inverted version of the signal PWMH, the circuit 582H may use the signal PWML, which approximately corresponds to the inverted version of the signal PWMH.

Accordingly, in the embodiment considered, the signal ENH1 and PWMH/PWML are set to high when the respective signal is set (approximately) to $V_{in}$, and to low when the respective signal is set (approximately) to ground. Conversely, the signals PWMH', ENH1' and PWMH1 are set to high when the respective signal is set (approximately) to $V_{BOOT}$, and to low when the respective signal is set (approximately) to $V_{SW}$.

Figure 22:
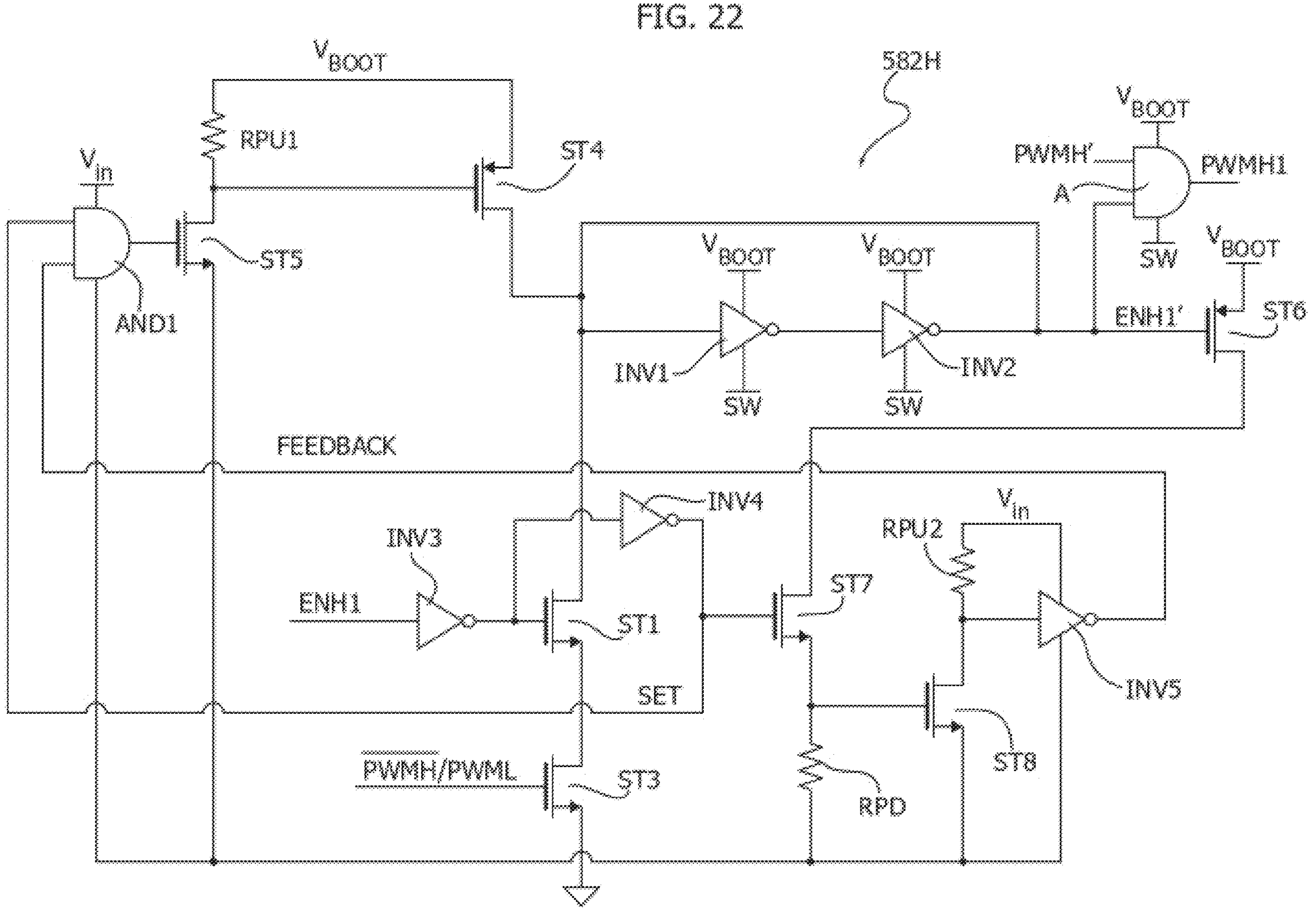
FIGS. 22 and 23 show a second embodiment of a level shifter for the circuit of FIG. 19.

FIG. 22 shows a second embodiment of the circuit 582H configured to generate a generic high side signal, such as the PWMH1, as a function of the respective enable signal, such as ENH1, and the (level-shifted) signal PWMH'. Also, this circuit may also be used within the power stage driver circuit 58 in case a level shifter is required.

Furthermore, in the embodiment considered, the circuit 582H comprises a storage element. Specifically, in the embodiment considered, the storage element is again implemented with the inverters INV1 and INV2 connected to form a ring. However, also any multiple of two inverter stages may be used.

Accordingly, also in this case, the storage element, e.g., the output of the last inverter stage, should provide a level-shifted version ENH1' of the signal ENH1. In fact, in the embodiment considered, again a logic gate A, such as a AND gate, is used to generate the signa PWMH1 by combining the level-shifted signal PWMH' with the level-sifted signal ENH1'.

Specifically, in the embodiment considered, the circuit 582H comprises again the first subcircuit acting as a reset circuit for the signal ENH1'. For example, in the embodiment considered, the input of the first (or an odd) inverter stage is connected via the electronic switch ST1, and optionally the electronic switch ST3 to ground. Specifically, the control terminal (e.g., the gate terminal) of the electronic switch ST1 is driven via the inverted version of the enable signal ENH1 and the control terminal (e.g., the gate terminal) of the electronic switch ST3 is driven via the inverted version of the high-side signal PWMH, or via the low-side signal PWML. Accordingly, the electronic switch ST1 and the optional electronic switch ST3 may be used to set the signal ENH1' to low when the signal ENH1 is low.

Accordingly, an additional set circuit for the signal ENH1' is required. Specifically, in the embodiment considered, the set circuit is implemented via a p-channel FET configured to connect the input of the first (or an odd) inverter stage to the supply voltage $V_{BOOT}$ when the gate node of the FET ST4 is connected to ground. Specifically, in the embodiment considered, the gate node of the p-channel FET ST4 is connected via a pull-up resistance RPU1 to the voltage $V_{BOOT}$ and via an electronic switch ST5, such as a n-channel FET, to ground. Accordingly, when the electronic switch ST5 is closed, the gate node of the FET ST4 is connected to ground and the FET ST4 connects the input of the first (or an odd) inverter stage to the supply voltage $V_{BOOT}$, whereby the signal ENH1' is set to high. Conversely, when the electronic switch ST5 is opened, the gate node of the FET ST4 is connected to the supply voltage $V_{BOOT}$ and the FET ST4 is opened, whereby the signal ENH1' maintains its logic level.

For example, in various embodiments, the control terminal (e.g., the gate terminal) of the electronic switch is driven via a signal SET, which corresponds to the signal ENH1, or a delayed version thereof, as shown again via two inverter stages INV3 and INV4. For example, in the simplest case, the signal SET may be applied directly to the control terminal of the electronic switch ST5, i.e., the electronic switch ST5 is closed when the signal SET is high and opened when the signal SET is low.

Conversely, in the embodiment considered, the control terminal of the electronic switch ST5 is driven via a logic AND gate AND1 receiving at input the set signal SET and a feedback signal FEEDBACK. Specifically, the feedback signal FEEDBACK is advantageous in order to improve the stability of the system. In the embodiment considered, the feedback signal FEEDBACK is used to generate only a pulse for setting the storage element when the signal ENH1' is de-asserted/set to low.

Specifically, in the embodiment considered, an electronic switch ST6 is connected with an electronic switch ST7 between a pull-down resistance RPD and the voltage $V_{BOOT}$, wherein the pull-down resistance RPD is connected to ground. Specifically, the electronic switch ST6, such as a p-channel FET, is configured to be closed when the signal ENH1 is set to low and the electronic switch ST7 is configured to be closed when the signal SET is asserted. Accordingly, the voltage at the pull-down resistance PDB is set to high, when the signal ENH1' is de-asserted and the signal SET is asserted, and the voltage at the pull-down resistance PDB is set to low, when the signal ENH1 is asserted or the signal SET is de-asserted. Accordingly, the voltage at the pull-down resistance RPD may be used as feedback signal FEEDBACK, or an additional level conversion circuit may be used to generate the feedback signal FEEDBACK as a function of the voltage at the pull-down resistance RPD. For example, in the embodiment considered, the level conversion circuit is implemented with a first inverter stage implemented with a pull-up resistance RPU2 and an electronic switch ST8, such as a n-channel FET, connected in series between the voltage $V_{in}$ and ground, wherein the control terminal (e.g., the gate terminal) of the electronic switch ST8 is connected to the voltage at the pull-down resistance RPD and the intermediate node between the pull-up resistance RPU2 and the electronic switch ST8 provides the inverted logic level of the voltage at the pull-down resistance RPD. Accordingly, an additional inverter INV5 (supplied by the voltage $V_{in}$) may be used to generate the feedback signal FEEDBACK by inverting the logic level at the intermediate node between the pull-up resistance RPU2 and the electronic switch ST8.

Accordingly, also in this case, the signals ENH1 and PWMH/PWML are set to high when the respective signal is set (approximately) to $V_{in}$, and to low when the respective signal is set (approximately) to ground. Conversely, the signals PWMH', ENH1' and PWMH1 are set to high when the respective signal is set (approximately) to $V_{BOOT}$, and to low when the respective signal is set (approximately) to $V_{SW}$.

Figure 23:
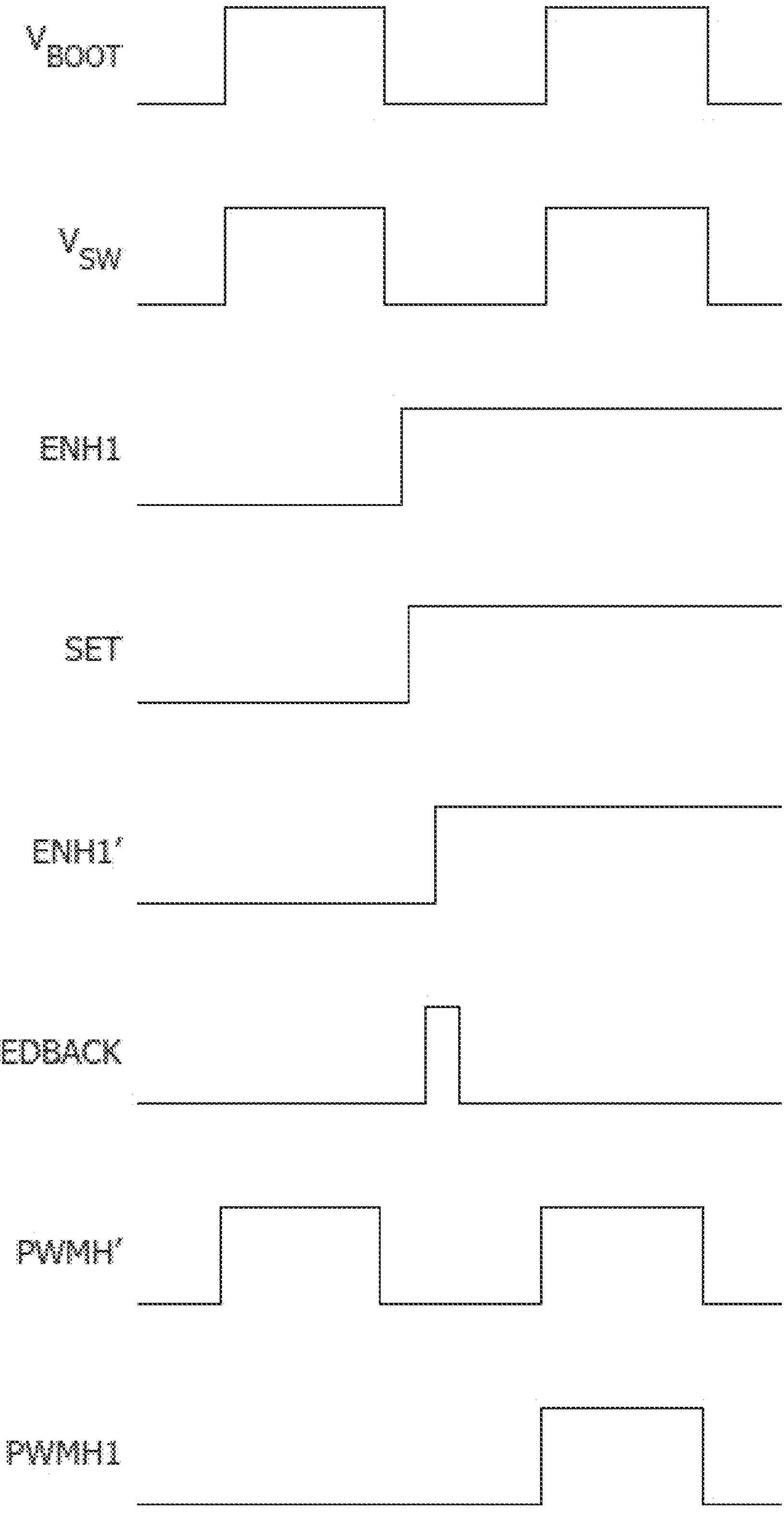

FIG. 23 shows in this respect possible waveforms of the floating voltage $V_{BOOT}$, the voltage $V_{SW}$ at the switching node (i.e., the floating ground for the voltage $V_{BOOT}$), the signal ENH1 (set to $V_{in}$ or ground), the enable signal ENH1, the set signal SET, the level-shifted signal ENH1, the feedback signal FEEDBACK (which, due to the propagation delays, is set to high for a short pulse when the signal SET is asserted and the signal ENH1' is de-asserted), the signal PWMH' and the signal PWMH1 (resulting from the combination of the signals PWMH' and ENH1').

As mentioned before, the circuits of FIGS. 21 and 22 may also be used for other enable signals ENH1-ENHK$_1$. In general, the voltage $V_{in}$ shown in FIGS. 21 and 22 may also not correspond to the voltage applied to the half-bridge QHB, but may be a different supply voltage.

Accordingly, the solutions disclosed herein have the advantage that the driver circuit may determine (via the signal trial_current_cfg) the optimal value $I_{rms,ON_{opt}}$ for a reference FET of the power stage Q. Specifically, this value takes into account the current operating conditions of the power stage Q, such as the switching frequency, the duty-cycle, the gate capacitance, the switch-on resistance and the gate-source voltage.

Moreover, in case of several power stages, such as the power stages QHS and QLS of a half-bridge, the partitioning value N may be determined for each power stage, e.g., different FETs S1-SK may be closed for the high-side power stage QHS and the low-side power stage QLS, thereby optimizing the power losses for each switching stage Q.

Of course, without prejudice to the principle of the invention, the details of construction and the embodiments may vary widely with respect to what has been described and illustrated herein purely by way of example, without thereby departing from the scope of the present invention, as defined by the ensuing claims.

The claims are an integral part of the technical teaching of the disclosure provided herein.

The invention claimed is:

1. A driver circuit, comprising:

a power stage comprising a plurality of FETs connected in parallel, wherein one of said plurality of FETs comprises a reference FET closed in response to application of a gate-source voltage;

an input configured to receive a Pulse-Width Modulated (PWM) signal with a given switching period, wherein said PWM signal is asserted for a switch-on period to control said power stage to be closed and de-asserted for a switch-off period to control said power stage to be opened;

a current sensor configured to provide a signal indicative of a current flowing through said power stage during said switch-on period;

a reference capacitance comprising a first scaled FET corresponding to a scaled version of said reference FET;

a reference resistance comprising a second scaled FET corresponding to another scaled version of said reference FET;

a first circuit configured to:

generate a ramp signal at said reference capacitance by connecting a gate terminal of said first scaled FET after a multiple of said given switching periods to ground and then applying a first current to the gate terminal of said first scaled FET, wherein said first current is proportional to a reference current; and assert a first PWM signal in response to determining that a voltage at said reference capacitance is smaller than a reference voltage and de-assert said first PWM signal in response to determining that the voltage at said reference capacitance is greater than said reference voltage, wherein said reference voltage is proportional to said gate-source voltage;

a second circuit configured to:

apply a second current to a further capacitance when said PWM signal is asserted, wherein said second current is proportional to said reference current;

generate a third current by applying a voltage proportional to said gate-source voltage to said reference resistance;

apply said third current to said further capacitance when a second PWM signal is asserted, wherein said third current and said second current have opposite signs; and assert said second PWM signal in response to a voltage at said further capacitance reaching an upper threshold and de-assert said second PWM signal in response to the voltage at said further capacitance reaching a lower threshold;

a duty-cycle comparison circuit configured to set a comparison signal to a first logic level in response to determining that a duty-cycle of said first PWM signal is greater than a duty-cycle of said second PWM signal and set the comparison signal to a second logic level in response to determining that the duty-cycle of said first PWM signal is smaller than the duty-cycle of said second PWM signal;

a control circuit configured to set said reference current to an initial value and then either increase or decrease said reference current until there is a change between the first and second logic levels of said comparison signal;

a comparison circuit configured to determine a respective enable signal for each FET of said plurality of FETs by comparing the value of said reference current in response to the change between the first and second logic levels of said comparison signal with said signal indicative of the current flowing through said power stage during said switch-on period; and a FET driver circuit configured to generate for each FET of said plurality of FETs a respective drive signal by combining the respective enable signal with said PWM signal.

2. The driver circuit of claim 1, wherein said signal indicative of the current flowing through said power stage during said switch-on period is indicative of a Root-Mean-Square value of said current flowing through said power stage during said switch-on period.

3. The driver circuit of claim 1, wherein said signal indicative of the current flowing through said power stage during said switch-on period is indicative of a maximum value of said current flowing through said power stage during said switch-on period.

4. The driver circuit of claim 1, wherein said comparison circuit is further configured to determine a signal indicative of a partitioning value of said power stage by:

determining for each partitioning value of a plurality of partitioning values respective upper and lower threshold values as a function of said value of said reference current in response to the change between the first and second logic levels of said comparison signal; and selecting one of said partitioning values by comparing said signal indicative of the current flowing through said power stage during said switch-on period with said upper and lower threshold values.

5. The driver circuit of claim 4, wherein each FET of said plurality of FETs has a respective partitioning factor and said comparison circuit is configured to:

determine said enable signals as a function of said partitioning factors of said plurality of FETs and a signal indicating said selected partitioning value.

6. The driver circuit of claim 1, further comprising a current digital-to-analog converter configured to generate said reference current as a function of a digital signal, and wherein said control circuit is configured to:

set said digital signal to an initial value; and then either increase or decrease said digital signal until said change between the first and second logic levels of said comparison signal; and then store said digital signal;

wherein said comparison circuit is configured to compare said stored digital signal with said signal indicative of the current flowing through said power stage during said switch-on period.

7. The driver circuit of claim 1, wherein said first circuit is configured to connect the gate terminal of said first scaled FET at the beginning of each switching period to ground.

8. The driver circuit of claim 1, wherein said duty-cycle comparison circuit comprises a differential current integrator, said duty cycle comparison configured to:

periodically reset said differential current integrator;

apply a first reference current to a first terminal of said differential current integrator when said first PWM signal is asserted;

apply a second reference current to a second terminal of said differential current integrator when said second PWM signal is asserted; and generate said comparison signal as a function of the differential voltage at the output of said differential current integrator.

9. The driver circuit of claim 1, wherein said FET driver circuit is configured to generate for each FET of said plurality of FETs a respective drive signal by:

asserting the respective drive signal when said PWM signal is asserted and the respective enable signal indicates that the respective FET is enabled; and de-asserting the respective drive signal when said PWM signal is de-asserted or the respective enable signal indicates that the respective FET is disabled.

10. A half-bridge driver circuit, comprising:

a driver circuit according to claim 1, wherein the power stage of said driver circuit is a low-side power stage comprising a plurality of low-side FETs connected between a switching node and a ground, wherein one of said plurality of low-side FETs represents said reference FET; wherein said input of said driver circuit is configured to receive a low-side PWM signal;

a high-side power stage comprising a plurality of high-side FETs connected between a supply voltage and said switching node; and a further input configured to receive a high-side PWM signal with said given switching period, wherein said high-side PWM signal is asserted for a switch-on period in order to indicate that said high-side power stage should be closed and de-asserted for a switch-off period in order to indicate that said high-side power stage should be opened;

wherein the current sensor of said driver circuit is configured to provide a signal indicative of the current provided by said switching node;

wherein the second circuit of said driver circuit is configured to:

in a low-side mode, apply said second current to said further capacitance when said low-side PWM signal is asserted; and in a high-side mode, apply said second current to said capacitance when the high-side PWM signal is asserted;

wherein the control circuit of said driver circuit is configured to:

in said low-side mode, set said reference current to an initial value and then either increase or decrease said reference current until the logic level of said comparison signal changes, and store a low-side value indicative of the value of said reference current when the logic level of said comparison signal changes, and in said high-side mode, set said reference current to an initial value and then either increase or decrease said reference current until the logic level of said comparison signal changes, and store a high-side value indicative of the value of said reference current when the logic level of said comparison signal changes;

wherein the comparison circuit of the driver circuit is configured to determine for each FET of said plurality of low-side FETs a respective low-side enable signal by comparing the low-side value with said signal indicative of the current provided by said switching node;

wherein the half-bridge driver circuit comprises a further comparison circuit configured to determine for each FET of said plurality of high-side FETs a respective high-side enable signal by comparing the high-side value with said signal indicative of the current provided by said switching node;

wherein the FET driver circuit of said driver circuit is configured to generate for each FET of said plurality of low-side FETs a respective drive signal by combining a respective low-side enable signal with said low-side PWM signal; and wherein the half-bridge driver circuit comprises a further FET driver circuit configured to generate for each FET of said plurality of high-side FETs a respective drive signal by combining a respective high-side enable signal with said high-side PWM signal.

11. The half-bridge driver circuit according to claim 10, wherein said further FET driver circuit comprises for each high-side enable signal a respective level-shifter circuit configured to generate a level-shifted version of the respective enable signal.

12. An integrated circuit comprising the half-bridge driver circuit according to claim 10.

13. A control circuit for an electronic converter, comprising:

the half-bridge driver circuit according to claim 10; and a PWM signal generator configured to generate said low-side PWM signal and said high-side PWM signal.

14. An integrated circuit comprising the control circuit according to claim 13.

15. A control circuit for an electronic converter, comprising:

the driver circuit according to claim 1; and a PWM signal generator configured to generate said PWM signal.

16. An integrated circuit comprising the control circuit according to claim 15.

17. An integrated circuit comprising the driver circuit according to claim 1.

18. A driver circuit, comprising:

a power stage comprising a plurality of FETs connected in parallel, wherein one of said plurality of FETs comprises a reference FET;

a FET driver circuit configured to generate for each FET of said plurality of FETs a respective drive signal by combining a respective enable signal with a PWM signal;

a current sensor configured to sense current flowing through said power stage;

a reference capacitance;

a reference resistance;

a first circuit configured to apply a first current to said reference capacitance to generate a ramp signal and compare the ramp signal to a reference voltage to generate a first PWM signal;

a second circuit configured to source a second current to a further capacitance in response to assertion of the PWM signal and sink a third current from said further capacitance in response to a second PWM signal, wherein the second PWM is asserted in response to a voltage at said further capacitance reaching an upper threshold and deasserted in response to the voltage at said further capacitance reaching a lower threshold;

a duty-cycle comparison circuit configured to compare duty cycles of the first and second PWM signals to generate a comparison signal;

a control circuit configured to apply a change in a value of said reference current until said comparison signal changes logic state; and a comparison circuit configured to generate the respective enable signals for said plurality of FETs in response to a comparison of the value of said reference current when the comparison signal changes logic state with the sensed current flowing through said power stage.

19. The driver circuit according to claim 18, wherein the sensed current flowing through said power stage is one of a Root-Mean-Square value of current flowing through said power stage or a maximum value of current flowing through said power stage.

20. The driver circuit according to claim 18, wherein each FET of said plurality of FETs has a respective partitioning factor and said comparison circuit is configured to determine said enable signals as a function of the partitioning factor a signal indicating a selected partitioning value.

21. The driver circuit according to claim 18, further comprising a current digital-to-analog converter configured to generate said reference current as a function of a digital signal.

* * * * *